United States Patent
Fujii et al.

(10) Patent No.: US 10,211,807 B2
(45) Date of Patent: Feb. 19, 2019

(54) PIEZOELECTRIC WAFER, PIEZOELECTRIC VIBRATION PIECE, AND PIEZOELECTRIC VIBRATOR

(71) Applicant: DAISHINKU CORPORATION, Kakogawa-shi, Hyogo (JP)

(72) Inventors: Tomo Fujii, Kakogawa (JP); Kozo Shibutani, Kakogawa (JP); Satoru Ishino, Kakogawa (JP); Yoshinari Morimoto, Kakogawa (JP); Tadataka Koga, Kakogawa (JP); Kazuki Otani, Kakogawa (JP)

(73) Assignee: Daishinku Corporation, Hyogo (JP)

( * ) Notice: Subject to any disclaimer, the term of this patent is extended or adjusted under 35 U.S.C. 154(b) by 446 days.

(21) Appl. No.: 15/036,734

(22) PCT Filed: Sep. 17, 2014

(86) PCT No.: PCT/JP2014/004781
§ 371 (c)(1),
(2) Date: May 13, 2016

(87) PCT Pub. No.: WO2015/072056
PCT Pub. Date: May 21, 2015

(65) Prior Publication Data
US 2016/0260887 A1 Sep. 8, 2016

(30) Foreign Application Priority Data

Nov. 13, 2013 (JP) ................. 2013-235325
Nov. 22, 2013 (JP) ................. 2013-242351
(Continued)

(51) Int. Cl.
*H01L 41/047* (2006.01)
*H01L 41/09* (2006.01)
(Continued)

(52) U.S. Cl.
CPC ....... *H03H 9/0595* (2013.01); *H01L 41/0475* (2013.01); *H01L 41/053* (2013.01);
(Continued)

(58) Field of Classification Search
CPC .... H03H 9/0595; H03H 3/02; H03H 9/02393; H03H 9/10; H03H 9/21; H03H 9/215; H01L 41/0475; H01L 41/053; H01L 41/33
(Continued)

(56) References Cited

U.S. PATENT DOCUMENTS

2005/0225199 A1   10/2005   Satoh et al.
2009/0205178 A1   8/2009    Kobayashi
2013/0020915 A1   1/2013    Sakamoto

FOREIGN PATENT DOCUMENTS

JP   2003-198303       7/2003
JP   2003-531808 A  *  11/2005  ............... H03H 3/02
(Continued)

*Primary Examiner* — Thomas Dougherty
(74) *Attorney, Agent, or Firm* — Norris McLaughlin, P.A.

(57) ABSTRACT

This piezoelectric wafer has: a piezoelectric vibration piece; a frame portion that supports the piezoelectric vibration piece; and a coupling portion that couples the piezoelectric vibration piece to the frame portion. The piezoelectric vibration piece is broken off at the coupling portion and separated from the piezoelectric wafer. On front and back surfaces of the coupling portion, grooved slits extending along a width direction of the coupling portion are formed except for parts of the coupling portion in the width direction. An electrode on at least one of front and back surfaces of the piezoelectric vibration piece is extracted to a frame-portion side of the piezoelectric wafer by way of the part of the coupling portion in the width direction.

31 Claims, 30 Drawing Sheets

(30) Foreign Application Priority Data

Nov. 22, 2013 (JP) .................................. 2013-242352
Nov. 22, 2013 (JP) .................................. 2013-242353

(51) Int. Cl.
*H01L 41/22* (2013.01)
*H03H 9/21* (2006.01)
*H03H 9/05* (2006.01)
*H03H 9/215* (2006.01)
*H01L 41/053* (2006.01)
*H01L 41/33* (2013.01)
*H03H 9/02* (2006.01)
*H03H 9/10* (2006.01)
*H03H 3/02* (2006.01)

(52) U.S. Cl.
CPC ............... *H01L 41/33* (2013.01); *H03H 3/02* (2013.01); *H03H 9/02393* (2013.01); *H03H 9/10* (2013.01); *H03H 9/21* (2013.01); *H03H 9/215* (2013.01); *H03H 2003/026* (2013.01)

(58) Field of Classification Search
USPC .................................................. 310/310–371
See application file for complete search history.

(56) References Cited

FOREIGN PATENT DOCUMENTS

| | | | | |
|---|---|---|---|---|
| JP | 2007-096899 | 4/2007 | | |
| JP | 2008-178021 | 7/2008 | | |
| JP | 2009-194630 | 8/2009 | | |
| JP | 2010-062789 | 3/2010 | | |
| JP | 2010-087842 A | * 4/2010 | ............... | H03H 3/02 |
| JP | 2010-178064 | 8/2010 | | |
| JP | 2011-160016 | 8/2011 | | |
| JP | 2012-023528 | 2/2012 | | |
| JP | 2012-054893 | 3/2012 | | |
| JP | 2013-098738 | 5/2013 | | |
| JP | 2013-187639 A | 9/2013 | | |
| JP | 2013-207509 | 10/2013 | | |
| WO | 2012/108335 | 8/2012 | | |

* cited by examiner

PIEZOELECTRIC WAFER, PIEZOELECTRIC VIBRATION PIECE, AND PIEZOELECTRIC VIBRATOR

BACKGROUND OF THE INVENTION

The invention relates to a piezoelectric wafer including piezoelectric vibration pieces, frame portions for supporting the piezoelectric vibration pieces, and coupling portions for coupling the piezoelectric vibration pieces to the frame portions, piezoelectric vibration pieces to be broken off and separated from the frame portions into individual pieces, and a piezoelectric vibrator in which a piezoelectric vibration piece is supportably mounted in a package.

Conventionally, piezoelectric wafers have a structure in which a large number of piezoelectric vibration pieces are supported by frame portions with the aid of coupling portions. This structure enables multiple piezoelectric vibration pieces to be obtainable at once from one piezoelectric wafer. The piezoelectric vibration pieces are broken off at the coupling portions and separated into individual pieces.

Some of the known piezoelectric wafers may have grooved slits formed in the coupling portions, which may be helpful in breaking off the piezoelectric vibration pieces at the coupling portions from the frame portions (refer to JP 2013-207509 A).

SUMMARY OF THE INVENTION

Notably, a photolithography-utilized fabrication technique, when processing a piezoelectric wafer in an outer shape in which a large number of piezoelectric vibration pieces are supported by the frame portions via the coupling portions, simultaneously forms grooved slits as well that render the piezoelectric vibration pieces easily breakable at the coupling portions when separated from the frame portions.

As a result, a piezoelectric wafer material is obtained, which has an outer shape in which multiple piezoelectric vibration pieces are supported by the frame portions via the coupling portions with the grooved slits formed therein. Then, an electrode film is formed on its entire surface by vapor deposition and etched into required electrode patterns.

In case the piezoelectric vibration piece is, for example, a tuning fork piezoelectric vibration piece, the required electrode patterns may include the patterns of driving electrode such as electrodes on front, back, and side surfaces of vibration arm portions.

Before the breaking off the piezoelectric vibration pieces from the piezoelectric wafer, the piezoelectric vibration pieces are driven through voltage application, and the electrodes are scraped off for coarse frequency adjustments. To enable voltage application for frequency adjustments in the piezoelectric vibration piece, the required electrode patterns should necessarily include patterns of a pair of electrodes for frequency adjustment to extract the driving electrodes from the coupling portion to the frame portion.

It may be useful in breaking off the piezoelectric vibration piece from the frame portion to form the grooved slits linearly across the entire width of the coupling portion.

As described earlier, the electrode film is formed on the whole surface of the piezoelectric wafer material formed in an outer shape in which multiple piezoelectric vibration pieces are supported by the frame portions via the coupling portions with the grooved slits formed therein. The electrode film formed on the whole surface of the piezoelectric wafer material at this stage possibly remains in the grooved slits and on the side surfaces of the coupling portions, incurring inter-electrode electrical short circuits.

Beside this possible problem, it is necessary to extract the electrodes for frequency adjustment avoiding any contact with the grooved slits in order to prevent the occurrence of wire disconnection in the electrodes for frequency adjustment.

This invention is directed to facilitating the removal of piezoelectric vibration pieces from a piezoelectric wafer and affording reliable frequency adjustments in a piezoelectric wafer without inviting the risks of electrical short circuits and/or wire disconnection.

A piezoelectric wafer according to the invention includes a piezoelectric vibration piece, a frame portion that supports the piezoelectric vibration piece, and a coupling portion that couples the piezoelectric vibration piece to the frame portion, wherein the piezoelectric vibration piece is to be broken off from the frame portion at the coupling portion, grooved slits extending along a width direction of the coupling portion are formed on front and back surfaces of the coupling portion except for a part of the coupling portion in the width direction, and electrodes on at least one of front and back surfaces of the piezoelectric vibration piece are extracted to a frame-portion side of the piezoelectric wafer by way of the part of the coupling portion in the width direction.

In the piezoelectric wafer according to this invention, the piezoelectric vibration piece may be easily broken off and separated from the frame portion with the aid of the grooved slits formed in the coupling portion. It is possible in the piezoelectric wafer that the electrode film continuous to the electrodes of the piezoelectric vibration piece is left unetched on both side surfaces of the coupling portion, and the electrode film is also left unetched in the grooved slits. In that case, the electrode film left on one of the both side surfaces of the coupling portion may possibly be electrically short-circuited with respect to the electrode film left unetched in the grooved slits. Yet, the parts of the coupling portion in the width direction may prevent electrical short circuit of the electrode film left on the other one of the both side surfaces of the coupling portion. Thus, it may be avoidable that the electrodes of the piezoelectric vibration piece are both electrically short-circuited. Then, the piezoelectric vibration piece may be driven through voltage application to the electrodes of the piezoelectric vibration piece. In this piezoelectric wafer, the electrodes of the piezoelectric vibration piece are extracted to the frame-portion side by way of the part of the coupling portion in the width direction. Extracting the electrodes of the piezoelectric vibration piece in this manner may avoid wire disconnection and/or electrical short circuits unlike extracting the electrodes of the piezoelectric vibration piece through the grooved slits.

According to a preferred aspect of the invention, the grooved slits are formed on both sides of the part of the coupling portion in the width direction in a manner that the part is interposed between the grooved slits.

It is possible that electrical short circuit occurs between the electrode film remaining on one of the both side surfaces of the coupling portion and the electrode film remaining in the grooved slit formed on one of the sides across the part of the coupling portion in the width direction. It is also possible that electrical short circuit occurs between the electrode film remaining on the other one of the both side surfaces of the coupling portion and the electrode film remaining in the grooved slit formed on the other one of the sides across the part of the coupling portion in the width direction. According to this aspect wherein the grooved slits are formed on both sides of the part of the coupling portion in the width direction in a manner that the part of the coupling portion are interposed between the grooved slits, however, electrical short circuit may be avoidable between the electrode films remaining on each of the both side surfaces of the coupling portion.

According to another preferred aspect of the invention, the electrodes extracted to the frame-portion side of the piezoelectric wafer constitute a pair of electrodes for frequency adjustment, and the pair of electrodes for frequency adjustment are formed on one of the front and back surfaces of the coupling portion.

According to this aspect, the electrodes extracted to the frame-portion side of the piezoelectric wafer are the paired electrodes for frequency adjustment. Unlike electrodes extracted through the grooved slits, the paired electrodes for frequency adjustment may be extractable to the frame-portion side of the piezoelectric wafer without inviting the risks of wire disconnection and/or electrical short circuits. Before the piezoelectric vibration piece is broken off and separated from the frame portion, the piezoelectric vibration piece may be adjustable in frequency through voltage application for frequency adjustments to the electrodes. Since individual electrodes instituting the paired electrodes for frequency adjustment are formed on one of the front and back surfaces of the piezoelectric vibration piece, it may advantageously be compatible with a frequency adjustment mechanism of a piezoelectric vibration piece with measurement terminals arranged alone on its one surface of the frame-portion side in the same manner.

With the paired electrodes for frequency adjustment being formed on one of the front and back surfaces of the coupling portion, extracting the electrodes of the piezoelectric vibration piece as the electrodes for frequency adjustment becomes unnecessary in the part of the coupling portion in the width direction on the other one of the front and back surfaces of the coupling portion. Therefore, reducing in width the part in the width direction may render the piezoelectric vibration piece easily breakable at the coupling portion.

According to yet another preferred aspect of the invention, the electrode extracted to the frame-portion side is a pair of electrodes for frequency adjustment, and one electrode and another electrode of the pair of electrodes for frequency adjustment are respectively formed on the front and back surfaces of the coupling portion.

As with the aspect described earlier, the paired electrodes for frequency adjustment may be extractable to the frame-portion side of the piezoelectric wafer without wire disconnection and/or electrical short circuits unlike electrodes extracted through the grooved slits. Before the piezoelectric vibration piece is broken off and separated from the frame portion, the piezoelectric vibration piece may be adjustable in frequency through voltage application for frequency adjustments to the electrodes.

According to this aspect, since individual electrodes constituting the pair of electrodes for frequency adjustment are respectively formed on the front and back surfaces of the coupling portion, it may advantageously be compatible with the frequency adjustment mechanism of a piezoelectric vibration piece with measurement terminals arranged on its front and back surfaces in the same manner.

According to this aspect, unlike the earlier aspect, individual electrodes constituting the paired electrodes for frequency adjustment are formed on the front and back surfaces of the coupling portion. This may allow for width reductions of the parts in the width direction on the front and back surfaces of the coupling portion, rendering the piezoelectric vibration piece easily breakable at the coupling portion.

According to yet another preferred aspect of the invention, a plurality of the grooved slits are formed on each of the front and back surfaces of the coupling portion along the width direction.

According to this aspect, the plural grooved slits are formed on each of the front and back surfaces of the coupling portion along the width direction. Then, the grooved slits may be formed so as to partly overlap with one another in a thickness direction of the coupling portion on the front and back surfaces so as to reduce the coupling portion in thickness at the slit-overlapping position. This may render the piezoelectric vibration piece more easily breakable at the coupling portion.

According to yet another preferred aspect of the invention, the parts of the coupling portion in the width direction on the front and back surfaces thereof are formed at positions displaced from each other in the width direction.

According to this aspect wherein the parts of the coupling portion large in thickness on the front and back surfaces thereof are formed at positions displaced from each other in the width direction, it may be avoidable to increase the thickness of a certain region of the coupling portion alone. This may make it easier to break off the piezoelectric vibration piece at the coupling portion.

A piezoelectric vibration piece according to this invention is a piezoelectric vibration piece broken off and separated from the frame portion of the piezoelectric wafer. A break-off end part of the piezoelectric vibration piece broken off from the frame portion has planar parts in which the front and back surfaces of the piezoelectric vibration piece are continuous as far as a break-offend of the break-offend part, and bent parts in which the front and back surfaces of the piezoelectric vibration piece are bending, wherein the planar parts and the bent parts are formed in a direction in which the piezoelectric vibration piece is broken off. On the front and back surfaces, the bent parts are bending toward the front-surface side or the back-surface side of the piezoelectric vibration piece to reduce in thickness. In the planar part to which at least one of the front and back surfaces is continuous, the electrodes of the piezoelectric vibration piece are extracted to the break-off end.

Possibly, the electrode film may be left on the side surfaces on both sides of the piezoelectric vibration piece broken off and separated from the frame portion of the piezoelectric wafer, and may also be left at the bent parts on the front and back surfaces of the break-offend part. In this piezoelectric vibration piece having the planar parts continuous to the break-offend of the break-off end part on front and back surfaces of the break-offend part, the planar parts serve to prevent electrical short circuit between the electrode films on the side surfaces of the piezoelectric vibration piece. This piezoelectric vibration piece, therefore, may be driven as required through voltage application to the electrodes.

In the piezoelectric vibration piece according to yet another preferred aspect of the invention, the planar part to which the front surface of the piezoelectric vibration piece is continuous and the planar part in which the back surface of the piezoelectric vibration piece is continuous are formed at positions displaced from each other in the direction in which the piezoelectric vibration piece is broken off.

In the piezoelectric vibration piece according to yet another preferred aspect of the invention, the electrode extracted to the break-end is a pair of electrodes for frequency adjustment, and the pair of electrodes for frequency adjustment is formed in the planar part to which one of the front and back surfaces is continuous.

In the piezoelectric vibration piece according to yet another preferred aspect of the invention, the electrode extracted to the break-end is a pair of electrodes for frequency adjustment, and one electrode and another electrode of the pair of electrodes for frequency adjustment are formed in the planar parts to which the front and back surfaces are continuous.

The piezoelectric wafer according to this invention is characterized in that the grooved slits extending along the width direction of the coupling portion are formed on the front and back surfaces of the coupling portion that couples the piezoelectric vibration piece to the frame portion, and these grooved slits are formed on the front and back surfaces of the coupling portion except for the parts thereof in the width direction, and the electrode of the piezoelectric vibration piece on at least one of the front and back surfaces of the coupling portion is extracted to the frame-portion side of the piezoelectric wafer by way of the part of the coupling portion in the width direction.

It is possible in the piezoelectric wafer that the electrode film continuous to the electrodes of the piezoelectric vibration piece is left unetched on the side surfaces on both sides of the coupling portion, and the electrode film is also left unetched in the grooved slits. The piezoelectric wafer thus advantageously may avoid electrical short circuit between the electrode films remaining on the side surfaces of the coupling portion.

The piezoelectric wafer is advantageous in that, before the piezoelectric vibration piece is broken off and separated from the frame portion at the coupling portion, frequency adjustments of the piezoelectric vibration piece may be reliably achievable through voltage application to the electrodes.

The piezoelectric wafer may be further advantageous in that the piezoelectric vibration piece is easily breakable at the coupling portion with the aid of the grooved slits of the coupling portion and separated from the frame portion.

BRIEF DESCRIPTION OF THE DRAWINGS

FIG. 4a is an enlarged front surface view of a crystal vibration piece separated from the frame portion of the crystal wafer illustrated in FIG. 2a.

FIG. 5a is a partly enlarged front surface view of the crystal wafer illustrated in FIG. 3a.

FIG. 5b is an A-A sectional view of the illustration of FIG. 5a.

FIG. 6b is a B-B sectional view of the illustration of FIG. 6a.

FIG. 6c is a partly enlarged back surface view of the crystal wafer illustrated in FIG. 6a.

FIG. 7b is a C-C sectional view of the illustration of FIG. 6a.

FIG. 7c is a partly enlarged back surface view of the crystal wafer illustrated in FIG. 7a.

FIG. 8b is a D-D sectional view of the illustration of FIG. 8a.

FIG. 8c is a partly enlarged back surface view of the crystal wafer illustrated in FIG. 8a.

FIG. 9b is an E-E sectional view of the illustration of FIG. 9a.

FIG. 9c is a partly enlarged back surface view of the crystal wafer illustrated in FIG. 9a.

FIG. 17a is a front surface view of a crystal vibration piece separated from a frame portion of the crystal wafer illustrated in FIG. 15a.

FIG. 22b is a back surface view of the crystal vibration piece illustrated in FIG. 22a.

FIG. 26 is a characteristic chart showing the vibration leakages in the crystal vibration piece illustrated in FIG. 22a.

FIG. 27 is an overall plan view of a crystal wafer for use in fabricating the crystal vibration piece illustrated in FIG. 22a.

DETAILED DESCRIPTION OF THE INVENTION

Figure 1:
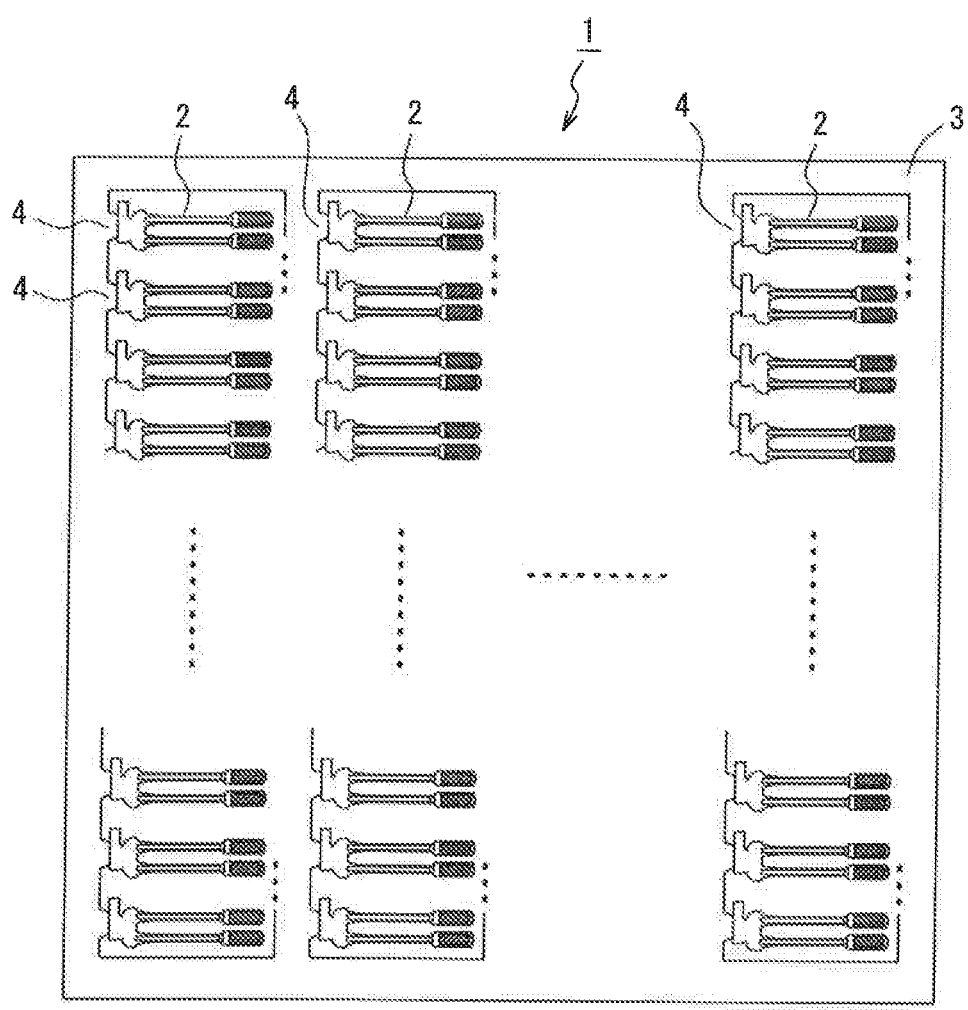
FIG. 1 is an overall view of a crystal wafer according to a first embodiment of the invention.
Figure 2A:
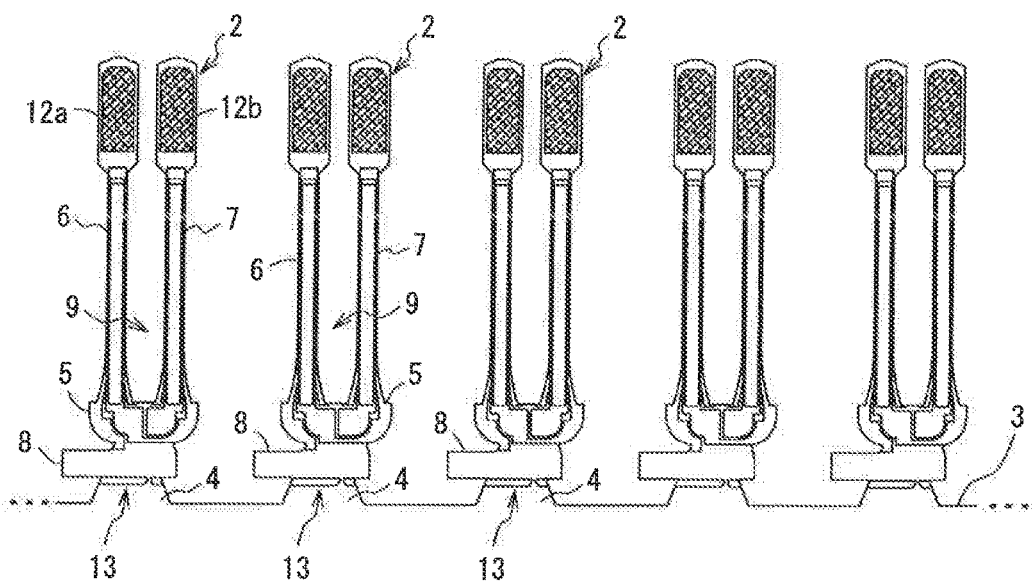
FIG. 2a is a partly enlarged view of the front-surface side of the crystal wafer illustrated in FIG. 1.
Figure 2B:
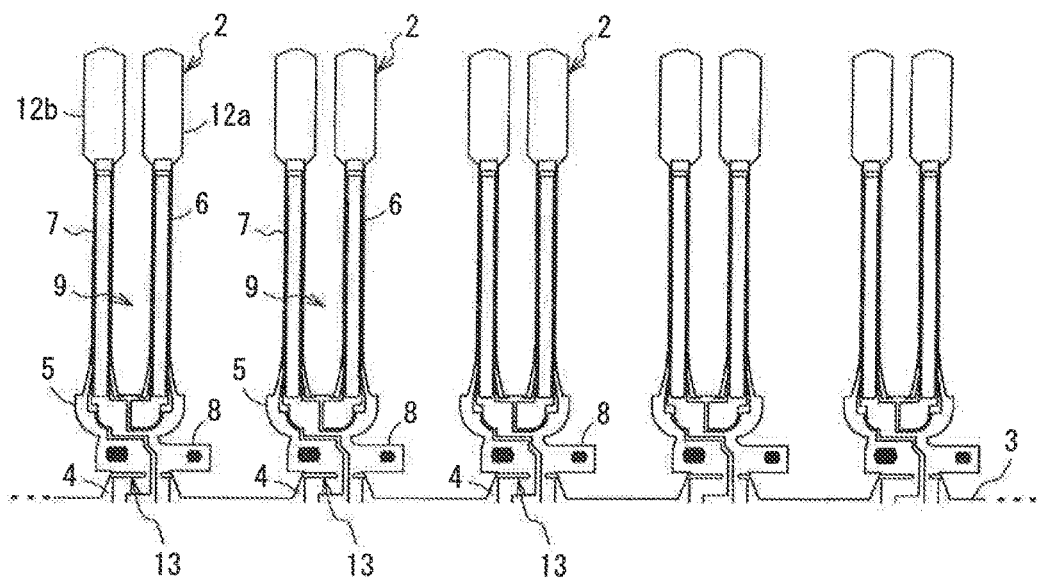
FIG. 2b is a partly enlarged view of the back-surface side of the crystal wafer illustrated in FIG. 1.
Figure 3A:
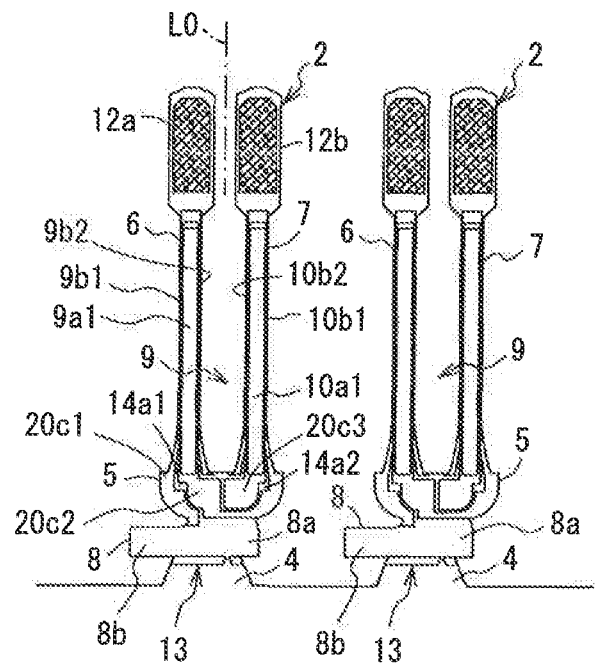
FIG. 3a is an enlarged front surface view of crystal vibration pieces before being separated from a frame portion of the crystal wafer illustrated in FIG. 2a into individual pieces.
Figure 3B:
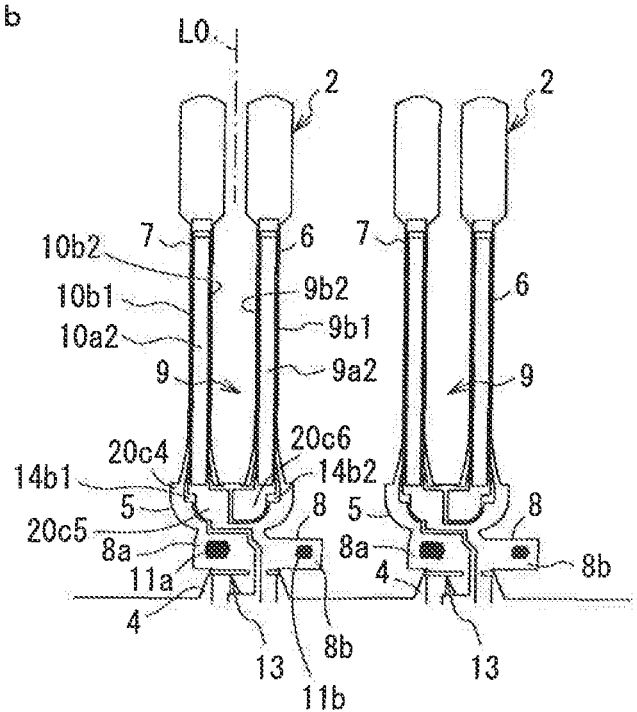
FIG. 3b is an enlarged back surface view of the crystal vibration pieces before being separated from the frame portion of the crystal wafer illustrated in FIG. 2b into individual pieces.

Hereinafter, first to fourth embodiments of this invention are described in detail referring to the accompanying drawings.

The embodiments of this invention use a Z-type crystal wafer (X-cut). The invention is, however, is not necessarily limited to crystal wafers and may be applicable to other wafers including piezoelectric wafers formed of piezoelectric materials, for example, lithium tantalate and lithium niobate.

The embodiments describe a tuning-fork type crystal vibration piece as an example of the piezoelectric vibration pieces. However, the tuning fork type described in the embodiments is a non-limiting example. The invention may be applicable to piezoelectric vibration pieces having other shapes.

In the accompanying drawings, the same or similar structural elements are illustrated with the same reference signs. While some technical and/or structural features may repeatedly appear in the embodiments, the other technical and/or structural features may not be repeatedly described to avoid redundancy.

First Embodiment

Referring to FIGS. 1 to 3b, a crystal wafer 1 according to a first embodiment of this invention is obtained by cutting a crystal substrate in a plate-like shape. The crystal wafer 1 is fabricated by wet-etching a resist pattern formed by photolithography. As a result, the crystal wafer 1 is fabricated that has crystal vibration pieces 2, frame portions 3 supporting the crystal vibration pieces 2, and coupling portions 4 coupling the crystal vibration pieces 2 to the frame portions 3.

The crystal vibration piece 2 has a base portion 5, a pair of first and second vibration arm portions 6 and 7 as vibrating units, and a junction portion 8. The base portion 5 has a laterally symmetric shape in plan view and is greater in width than the first and second vibration arm portions 6 and 7.

The first and second vibration arm portions 6 and 7 are protruding from one end surface of the base portion 5 and juxtaposed in parallel to each other with an interval 9 interposed therebetween. The interval 9 is present at the center in a direction in which the first and second vibration arm portions 6 and 7 are juxtaposed.

The first and second vibration arm portions 6 and 7 have edge parts greater in width than the other parts.

The first vibration arm portion 6 has driving electrodes 9a1 and 9a2 formed on its front and back surfaces. The first vibration arm portion 6 further has driving electrodes 9b1 and 9b2 formed on its side surfaces on both sides.

The second vibration arm portion 7 has driving electrodes 10a1 and 10a2 formed on its front and back surfaces. The first vibration arm portion 6 further has driving electrodes 10b1 and 10b2 formed on its side surfaces on both sides.

As in the well-known art, the driving electrodes 9a1 and 9a2 on the front and back surfaces of the first vibration arm portion 6 are connected to each other, and the driving electrodes 9b1 and 9b on the side surfaces on side surfaces of the first vibration arm 6 portion are connected to each other. Likewise, the driving electrodes 10a1 and 10a2 on the front and back surfaces of the second vibration arm portion 7 are connected to each other, and the driving electrodes 10b1 and 10b2 on the side surfaces of the second vibration arm portion 7 are connected to each other The driving electrodes 9a1 and 9a2 on the front and back surfaces of the first vibration arm portion 6 are respectively common-connected to the driving electrodes 10b1 and 10b2 on the front and back surfaces of the second vibration arm portion 7 to allow for the application of a voltage of a polarity.

The driving electrodes 9b1 and 9b2 on the front and back surfaces of the first vibration arm portion 6 are respectively common-connected to the driving electrodes 10a1 and 10a2 on the front and back surfaces of the second vibration arm portion 7 to allow for the application of a voltage of the other polarity.

The driving electrodes of the first and second vibration arm portion 6 and 7 are partly extracted to extraction electrodes 20c1 to 20c6 on the base portion 5.

Of the extraction electrodes 20c1 to 20c6, the extraction electrodes 20c4 and 20c5 on the back-surface side of the base portion 5 are further extracted to the junction portion 8, coupling portion 4, and frame portion 3. These extraction electrodes 20c4 and 20c5 serve as electrodes for applying the voltages of one and the other polarities.

The extraction electrodes 20c1 to 20c6 are electrically insulated from one another by discrete insulation lines 14a1, 14a2, 14b1, and 14b2.

The junction portion 8 has a basal end part 8a and an extended part 8b. The basal end part 8a is slightly protruding from the center position on the other end surface of the base portion 5 in the direction in which the first and second vibration arm portions 6 and 7 are juxtaposed. The extended part 8b is extending from the basal end part 8a toward one side in the direction in which the first and second vibration arm portions 6 and 7 are juxtaposed. The junction portion 8, with these parts thus arranged, has an L-like shape in plan view with respect to the base portion 5.

A first metal bump 11a having an elliptical shape in plan view is formed on the extraction electrode 20c4 at the basal end part 8a of the junction portion 8. A second metal bump 11b having an elliptical shape in plan view is formed on the extraction electrode 20c5 at the extended part 8b of the junction portion 8. These metal bumps are formed by electrolytic plating. The shapes of the first and second metal bumps 11a and 11b may be otherwise, for example, a circular shape in plan view. A preferable example of the electrolytic plating may be gold plating, which is, however, a non-limiting example.

When the crystal vibration piece 2 is mounted in a crystal vibration device not illustrated in the drawings, the first and second metal bumps 11a and 11b are bonded by ultrasonic bonding to a pair of opposing electrode pads on a part different in level or bottom surface of a package in the crystal vibration device.

The first metal bump 11a is formed at a position substantially at the center in the direction in which the first and second vibration arm portions 6 and 7 are juxtaposed. Specifically, the first metal bump 11a is formed at a position slightly displaced from the center position in the juxtaposition direction toward one side in the arm-juxtaposed direction. The second metal bump 11b is formed at a position displaced from the center position in the direction in which the first and second vibration arm portions 6 and 7 are juxtaposed toward the other side in the arm-juxtaposed direction.

A frequency-adjusting electrode 12a for weight and a frequency-adjusting electrode 12b for weight are formed by electrolyte plating at the edge parts on the front-surface sides of the first and second vibration arm portions 6 and 7. The frequency-adjusting electrodes 12a and 12b for weight may be decreased in mass by beam irradiation or increased in mass by partial vapor deposition in order for frequency adjustments of the crystal vibration piece 2.

The coupling portion 4 has a break-off part 13. This part is a section of the coupling portion 4 in a width direction thereof along the interface between the coupling portion 4 and the junction portion 8 of the crystal vibration piece 2. The break-off part 13 is extending across the entire width of the coupling portion 4 in the width direction. The break-off part 13 will be described later in further detail.

Figure 4A:
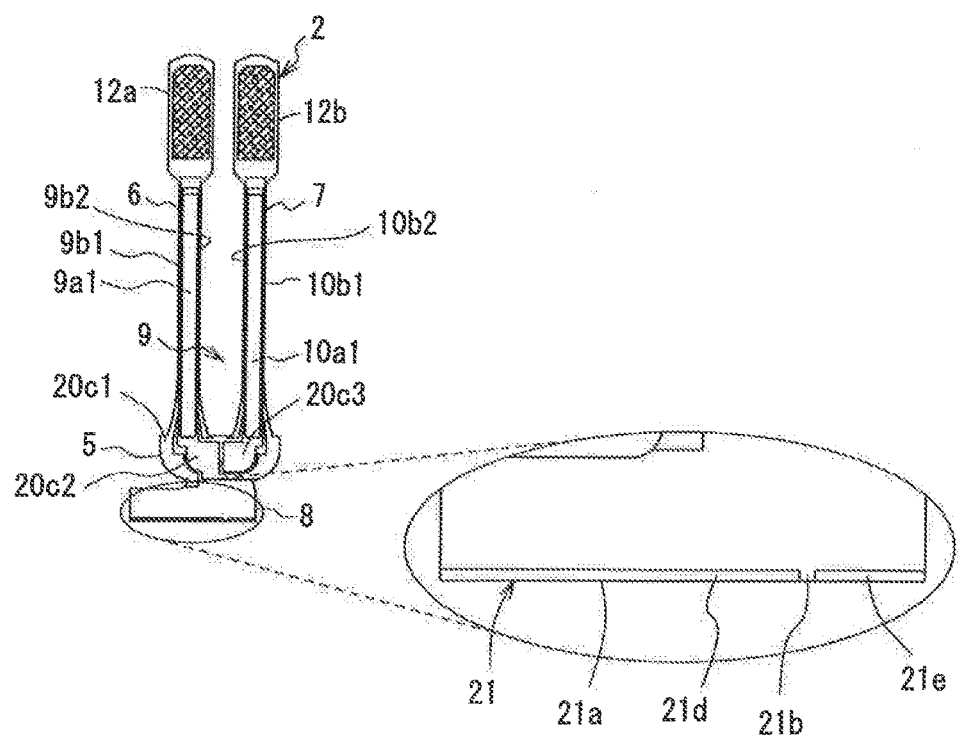
Figure 4B:
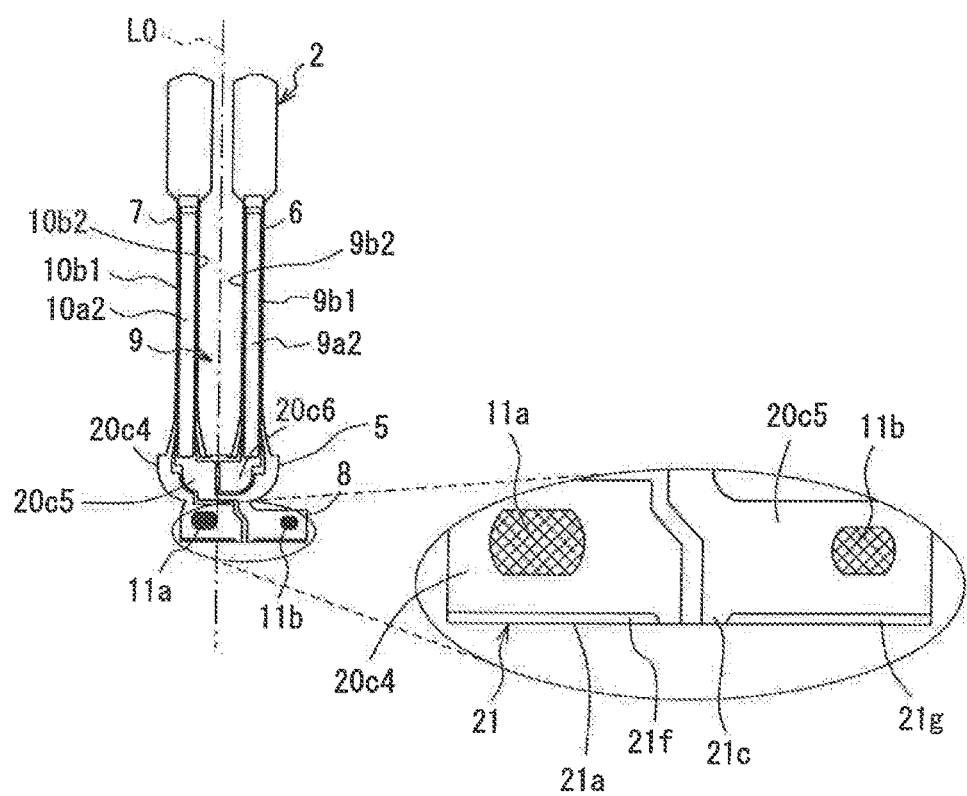
FIG. 4b is an enlarged back surface view of a crystal vibration piece separated from the frame portion of the crystal wafer illustrated in FIG. 2b.

In the crystal water 1 thus structurally characterized, the crystal vibration piece 2 is broken off at the break-off part 13 formed in the coupling portion 4 and separated from the frame portion 3 as illustrated in FIGS. 4a and 4b.

Referring to FIGS. 4a and 4b, the crystal vibration piece 2 has a break-off end part 21 on an end surface of the junction portion 8. The break-off end part 21 is formed when the crystal vibration piece 2 is broken off and separated from the crystal vibration piece 2 as illustrated in an enlarged view of a circled.

The break-offend part 21 has planar parts 21b and 21c and bent parts 21d to 21g in a direction in which the crystal vibration piece 2 is broken off. In the planar parts 21b and 21c, the front and back surfaces of the crystal vibration piece 2 are continuous to a break-off end 21a of the break-off end part 21. In the bent parts 21d to 21g, the front and back surfaces of the crystal vibration piece 2 are bending. The planar parts and the bent parts are formed along a direction in which the crystal vibration piece 2 is broken off.

In the planar part 21c of the planar parts 21b and 21c, the extracted electrodes 20c4 and 20c5 of the crystal vibration piece 2 are extracted as far as the break-off end 21a. The planar parts 21b and 21c are formed at positions displaced from each other in the direction in which the crystal vibration piece 2 is broken off.

The bent parts 21d to 21g may be U-shaped, V-shaped, obliquely shaped, or the like in cross section. The shapes of the bent parts 21d to 21g may depend on cross-sectional shapes of grooved slits 13a to 13d described later or which one of the grooved slits 13a to 13d is chosen as a position at which the crystal vibration piece 2 is broken off.

Since the grooved slits 13a to 13d described later are overlapping with one another in almost the entire thickness direction, the bent parts 21d to 21g are bending toward the front-surface side or the back-surface side to reduce in thickness.

Figure 5A:
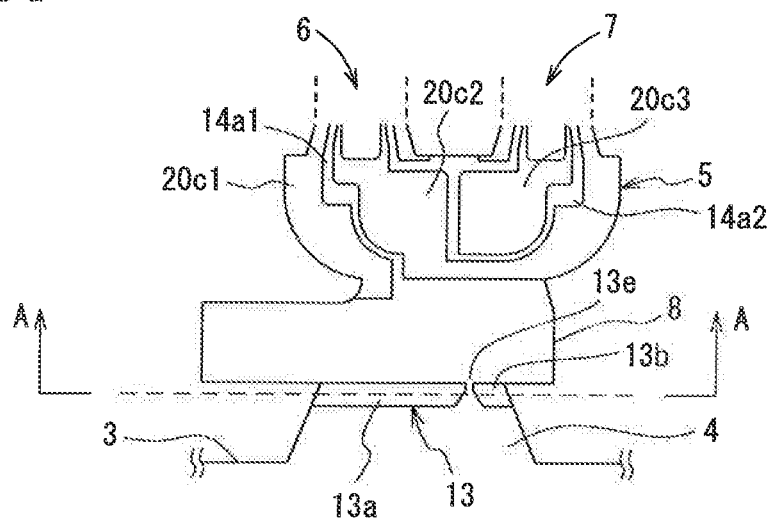
Figure 5B:
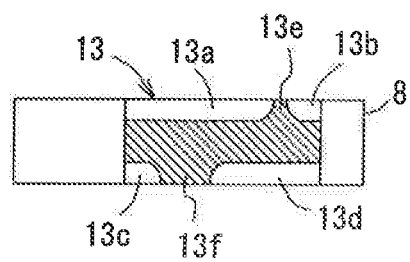
Figure 5C:
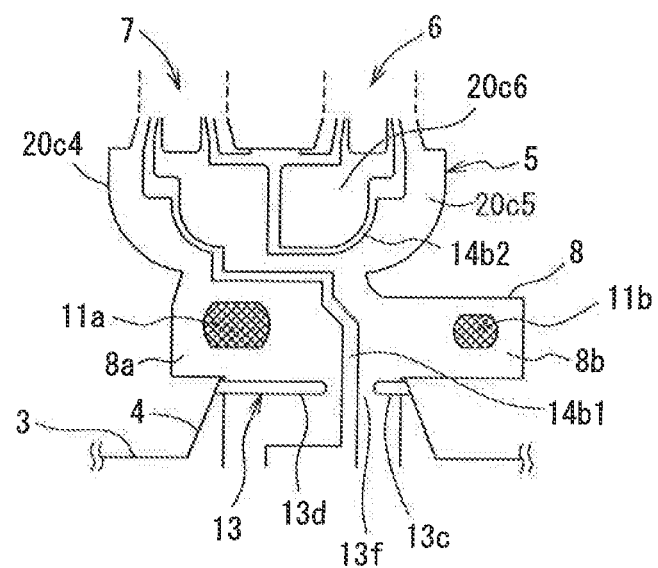
FIG. 5c is a partly enlarged back surface view of the crystal wafer illustrated in FIG. 3b.

The break-off part 13 is described referring to FIGS. 5a to 5c. FIG. 5a is a partly enlarged front surface view of the crystal wafer 1. FIG. 5b is an A-A sectional view of FIG. 5a. FIG. 5c is a partly enlarged back surface view of the crystal wafer 1.

The break-off part 13 has, on its front-surface side, two grooved slits 13a and 13b extending along the width direction of the coupling portion 4. These grooved slits 13a and 13b are, however, not formed in a part of the coupling portion 4 in the width direction. This part of the coupling portion 4 in the width direction constitutes a bridge 13e.

The grooved slits 13a and 13b are formed by etching. The bridge 13e, which is an unetched part, has a flat surface. The grooved slits 13a and 13b formed by etching may have a V-shape, a U-shape, or the like in cross section.

The break-off part 13 has, on its back-surface side, two grooved slits 13c and 13d extending along the width direction of the coupling portion 4. These grooved slits 13c and 13d are, however, not formed in a part of the coupling portion 4 in the width direction. This part of the coupling portion 4 in the width direction constitutes a bridge 13f.

The grooved slits 13c and 13d are formed by etching. The bridge 13f which is an unetched part, has a flat surface. The grooved slits 13c and 13d formed by etching may have a V-shape, a U-shape, or the like in cross section.

The break-off part 13 has, on its back-surface side, two grooved slits 13c and 13d extending along the width direction of the coupling portion 4. These grooved slits 13c and 13d are formed except for a part of the coupling portion 4 in the width direction. This part of the coupling portion 4 in the width direction constitutes a bridge 13f.

The grooved slits 13c and 13d are formed by etching. The bridge 13f, which is an unetched part, has a flat surface. The grooved slits 13c and 13d may likewise have a V-shape, a U-shape, or the like in cross section.

The bridge 13e on the front-surface side of the break-off part 13 is narrower in the width direction of the coupling portion 4 than the bridge 13f on the back-surface side. A distance in the width direction between the grooved slits 13a and 13b on the front-surface side is, therefore, shorter, making these grooved slits easily breakable.

The bridge 13f on the back-surface side does not overlap with the bridge 13e on the front-surface side, and is formed at a position displaced from the bride 13e in the width direction. This makes it easier to break off the crystal vibration piece 2 at the break-off part 13 and separate it from the frame portion 3.

The bridge 13f on the back-surface side has a large dimension in the width direction, making it easier to form the extraction electrodes 20c4 and 20c5 by way of the bridge 13f.

Of the extraction electrodes 20c1 to 20c6, the extraction electrodes 20c4 and 20c5 are connected to the first and second metal bumps 11a and 11b of the junction portion 8. These extraction electrodes, serving as a pair of electrodes for frequency adjustment, are also extracted from the coupling portion 4 to the frame portion 3 by way of the bridge 13f.

The extraction electrodes 20c4 and 20c5, which are intended for applying a voltage for frequency adjustment, are not formed in the grooved slits as in the prior art. These extraction electrodes are formed on a surface of the bridge 13f on the back-surface side of the break-off part 13 to prevent the occurrence of electrical short circuit and/or wire disconnection.

The fabrication of the crystal wafer 1 is described. First, a resist pattern is formed by photolithography. Then, the outer shape of this resist pattern is processed by wet etching to obtain a crystal wafer material with a base material being exposed on its entire surface.

Next, an electrode film is formed by vapor deposition on the entire surface. This electrode film formed on the entire surface is etched into required electrode patterns to fabricate the crystal wafer 1.

In connection with the formation of the driving electrodes 9b1 and 10b1 by etching on the side surfaces of the vibration arm portions 6 and 7, the electrode film may be left unetched on the side surfaces of the coupling portion. Assuming that the remaining electrode film is electrically short-circuited with respect to the electrode film left unremoved in the grooved slits 13a to 13d, the bridges 13e and 13f between the grooved slits 13a to 13d may effectively prevent electrical short circuit between the driving electrodes 9b1 and 10b1 on the side surfaces.

For frequency adjustments (coarse frequency adjustments) in the crystal wafer 1 so far described performed before the crystal vibration piece 2 is broken off from the frame portion 3, the frequency of the crystal vibration piece 2 may be measurable by applying the voltage for frequency adjustment to the extraction electrodes 20c4 and 20c5 extracted to the frame portion 3 as the electrodes for frequency adjustment.

Based on the measured frequency, the frequency-adjusting electrode portions for weight 12a and 12b at the edge parts of the first and second vibration arm portions 6 and 7 may be decreased in mass by laser beam irradiation or increased in mass by partial vapor deposition for frequency adjustments of the crystal vibration piece 2.

When the frequency adjustments are over, the crystal vibration piece 2 is broken off at the break-off part 13 and separated from the frame portion 3. A suitable break-off means may be employed to separate the crystal vibration piece 2. For example, a break-off pin, not illustrated in the drawings, may be moved downward and pushed into the crystal vibration piece 2 to separate the crystal vibration piece 2 from the frame portion 3.

After the crystal vibration piece 2 is thus separated, the first and second metal bumps 11a and 11b are bonded to the electrode pads in the package not illustrated in the drawings and supported in the package in a cantilever manner. Finally, a crystal vibration device is obtained.

As described so far, the crystal wafer 1 is advantageous in that the frequency adjustment of the crystal vibration piece 2 may be achievable before the crystal vibration piece 2 is separated from the wafer.

Figure 6A:
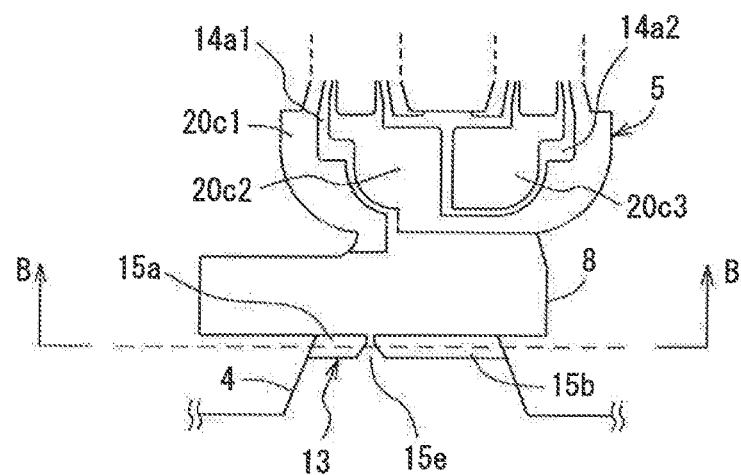
FIG. 6a is a partly enlarged front surface view of a crystal wafer having a break-off part according to a first modified example of the first embodiment.
Figure 6B:
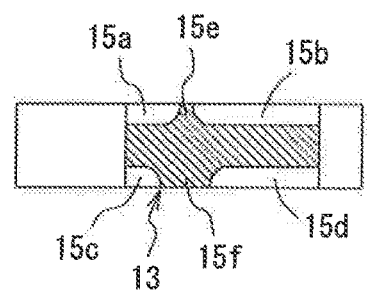
Figure 6C:
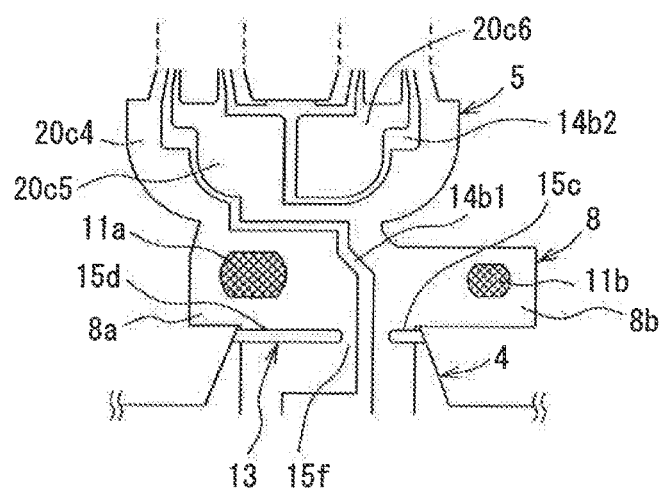

The shape of the break-off part 13 is not necessarily limited to any one of the before-mentioned shapes and may be variously modified. Hereinafter, modified examples of the break-off part 13 are described referring to FIGS. 6a to 9c Modified Examples of Break-off Part FIGS. 6a to 6c illustrate a first modified example of the break-off part 13.

A break-off part 13 according to the first modified example has, on its front-surface side, two grooved slits 15a and 15b, and a bridge 15e between the grooved slits 15a and 15b. This break-off part 13 according to the first modified example further has, on its back-surface side, two grooved slits 15c and 15d, and a bridge 15f between the grooved slits 15c and 15d.

The first modified example presents a structure in which the bridge 15f on the back-surface side and the bridge 15e on the front-surface side are overlapping with each other in the thickness direction of the break-off part 13.

According to the first modified example, the extraction electrodes 20c4 and 20c5, serving as the electrodes for frequency adjustment, are extracted to the frame portion 3 by way of the bridge 15f.

Figure 7A:
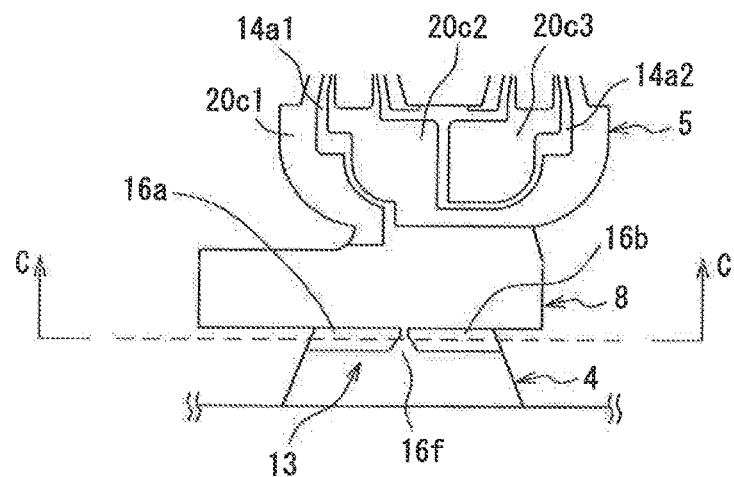
FIG. 7a is a partly enlarged front surface view of a crystal wafer having a break-off part according to a second modified example of the first embodiment.
Figure 7B:
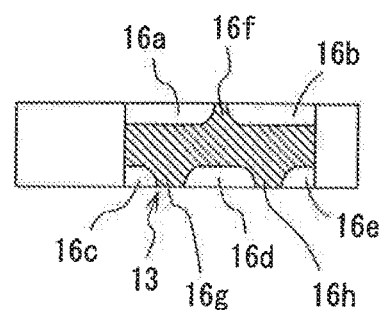
Figure 7C:
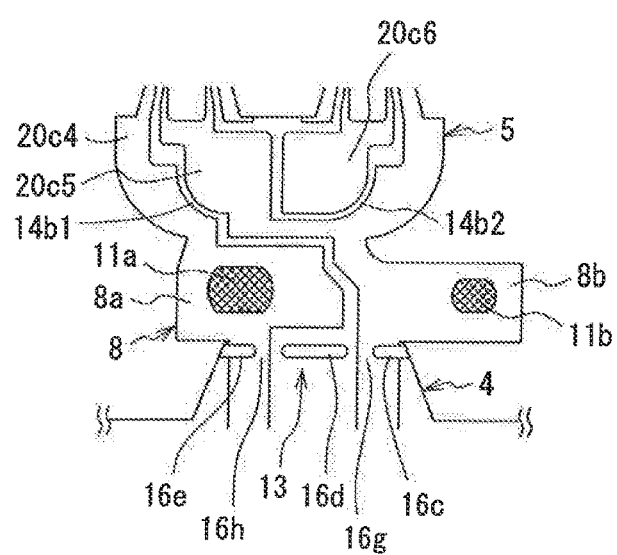

FIGS. 7a to 7c illustrate a second modified example of the break-off part 13.

A break-off part 13 according to the second modified example has, on its front-surface side, two grooved slits 16a and 16b, and a bridge 16f between the grooved slits 16a and 16b. The break-off part 13 according to the second modified example further has, on its back-surface side, three grooved slits 16c to 16e, and two bridges 16g and 16h among the grooved slits 16c to 16e.

The second modified example presents a structure in which the bridges 16f, 16g, and 16h on the front-surface side and the back-surface side are not overlapping with one another in the thickness direction of the break-off part 13.

According to the second modified example, the extraction electrodes 20c4 and 20c5, serving as the electrodes for frequency adjustment, are extracted to the frame portion 3 by way of the bridges 16h and 16g.

Figure 8A:
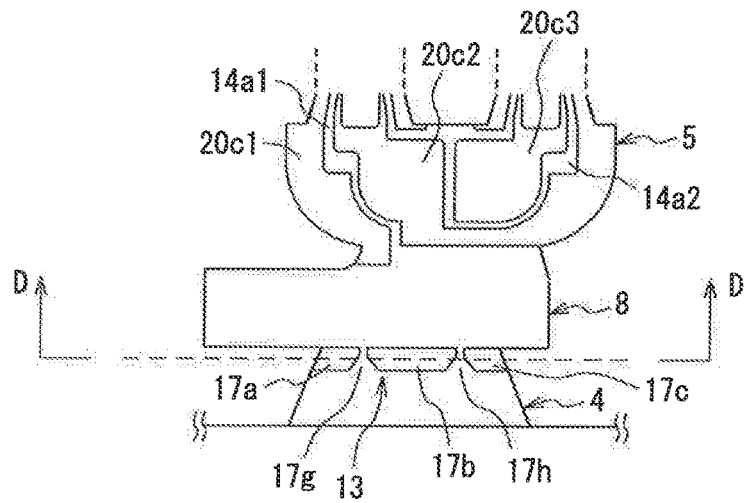
FIG. 8a is a partly enlarged front view of a crystal wafer having a break-off part according to a third modified example of the first embodiment.
Figure 8B:
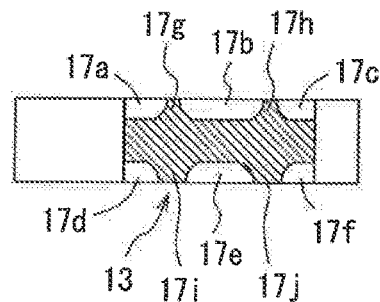
Figure 8C:
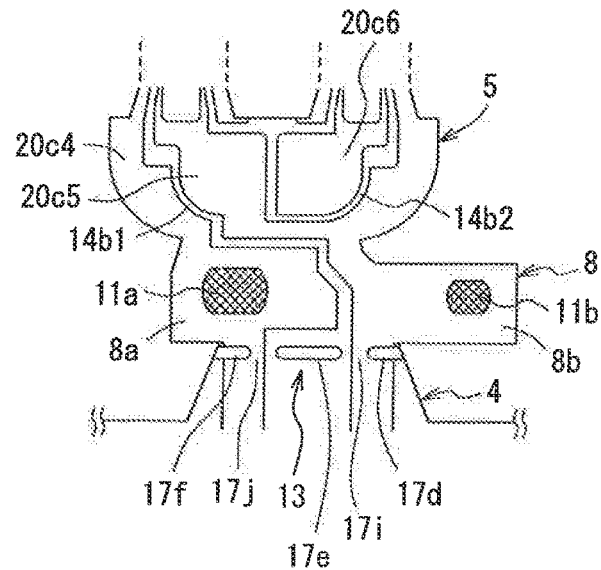

FIGS. 8a to 8c illustrate a third modified example of the break-off part 13.

A break-off part 13 according to the third modified example has, on its front-surface side, three grooved slits 17a to 17c, and two bridges 17g and 17h among the grooved slits 17a to 17c. The break-off part 13 according to the third modified example further has, on its back-surface side, three grooved slits 17d to 17f, and two bridges 17i and 17j among the grooved slits 17d to 17f.

The third modified example presents a structure in which the bridges on the front-surface side and the back-surface side are overlapping with one another in the thickness direction of the break-off part 13. According to the third modified example, the extraction electrodes 20c4 and 20c5, serving as the electrodes for frequency adjustment, are extracted to the frame portion 3 by way of the bridges 17i and 17j.

Figure 9A:
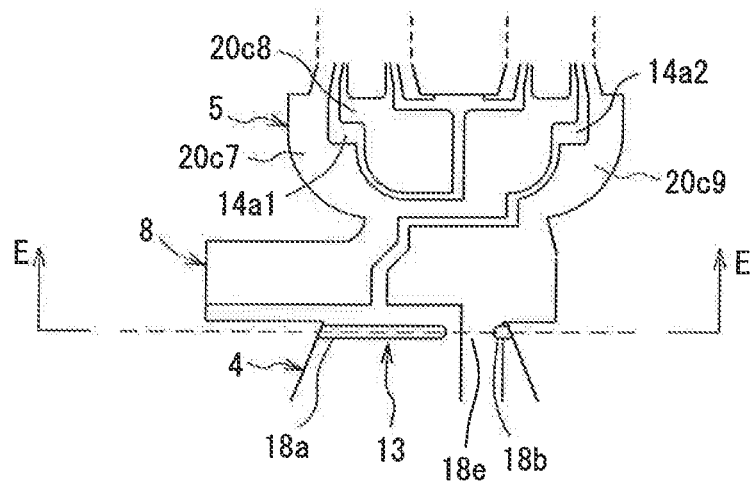
FIG. 9a is a partly enlarged front surface view of a crystal wafer having a break-off part according to a fourth modified example of the first embodiment.
Figure 9B:
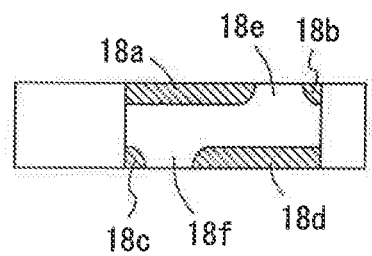
Figure 9C:
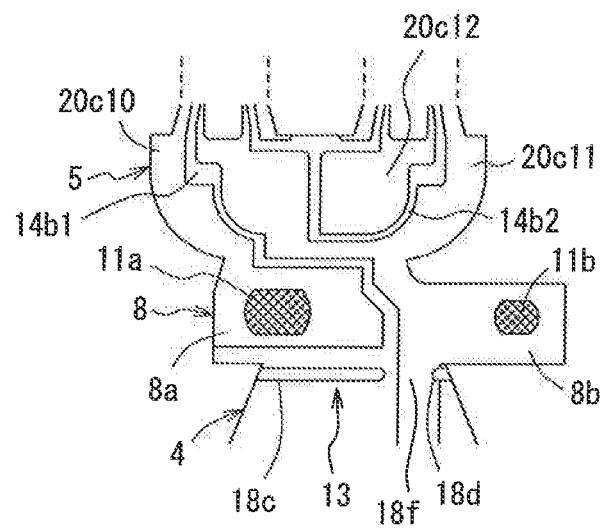

FIGS. 9a to 9c illustrate a fourth modified example of the break-off part 13.

A break-off part 13 according to the fourth modified example has, on its front-surface side, two grooved slits 18a and 18b, and a bridge 18e between the grooved slits 18a and 18b. This break-off part further has, on its back-surface side, two grooved slits 18c and 18d and a bridge 18f between the grooved slits 18c and 18d.

According to this modified example, extraction electrodes 20c7, 20c8, and 20c9 are formed on the front surface of the junction portion 8, and extraction electrodes 20c10, 20c11, and 20c12 are formed on the back surface of the junction portion 8. The reference signs 14a1, 14a2, 14b1, and 14b2 represent the discrete insulation lines.

The extraction electrodes 20c10 and 20c11 are connected to the first and second metal bumps 11a and 11b on the back-surface side of the junction portion 8, respectively. The extraction electrode 20c9 on the front-surface side of the junction portion 8 is extracted to the frame portion 3 by way of the bridge 18e. The extraction electrode 20c12 on the front-surface side of the junction portion 8 is extracted to the frame portion 3 by way of the bridge 18f. These extraction electrodes act as the electrodes for frequency adjustment.

Second Embodiment

A tuning-fork type crystal vibration piece according to a second embodiment of the invention is separated from a crystal wafer is essentially configured structurally and technically as with the first embodiment. Other than the technical features provided to prevent electrostatic destruction described later, the tuning-fork type crystal vibration piece according to the second embodiment is essentially configured structurally and technically as with the tuning-fork type crystal vibration piece of the crystal wafer according to the first embodiment.

The second embodiment provides a tuning-fork type crystal vibration piece advantageous in that the extraction electrodes, which extract the driving electrodes of the paired arm portions on the base portion, may be prevented from being electrostatically destroyed on the base portion.

The tuning fork-type vibration piece is mounted in the package of a crystal vibration device and incorporated as a crystal vibration unit. Such a crystal vibration device is further miniaturized in recent years. With this trend, the base portion of a crystal vibration piece mounted in the crystal vibration device is increasingly reduced in area dimension.

With the base portion smaller in area dimension, it is necessary to form the extraction electrodes on the base portion in a shorter width with a shorter interval therebetween. When the extraction electrodes are thinned and more closely spaced from each other on the base portion, however, electric discharge is likely to be triggered by current concentration at angular parts between the electrodes. The electric discharge may pose the risk of electrostatic destruction of the extraction electrodes.

The second embodiment, therefore, seeks to prevent electrostatic destruction of the extraction electrodes, thereby allowing the tuning-fork type crystal vibration piece to maintain required vibration characteristics.

To this end, a tuning-fork type crystal vibration piece according to an aspect of the second embodiment is characterized in that base portion extraction electrodes are formed on the base portion. The base portion extraction electrodes include a base portion extraction electrode for connection by which the driving electrodes are partly common-connected, and a pair of base portion extraction electrodes for external use to which the driving electrodes are partly externally extracted. The base portion extraction electrodes are greater in thickness than the driving electrodes formed on the front and back main surfaces of the vibration arm portions.

According to this aspect, the base portion extraction electrodes on the base portion are greater in thickness than the driving electrodes formed on the front and back main surfaces of the vibration arm portions. The base portion extraction electrodes increased in thickness are improved in mechanical strength. While the base portion may be increasingly narrowed, and the base portion extraction electrodes may be accordingly reduced in width and narrowly spaced from each other, the base portion extraction electrodes thus improved in mechanical strength may be less likely to be electrostatically destroyed by electric discharge. This may ensure that the vibration characteristics of the crystal vibration piece continue to be stable over a long period of time.

A tuning-fork type crystal vibration piece according to another aspect of the second embodiment is characterized in that edge-of-arm extraction electrodes by which the driving electrodes are partly common-connected are formed on edge sides of the vibration arm portions. The edge-of-arm extraction electrodes are greater in thickness than the driving electrodes, and the base portion extraction electrodes are at least substantially equal in thickness to the edge-of-arm extraction electrodes.

Conventionally, the base portion extraction electrodes are thinly formed like the driving electrodes. On the other hand, surface layers of the edge-of-arm extraction electrodes are plated with a metal for frequency adjustments of the crystal vibration piece. This aspect, by leveraging the step of plating the edge-of-arm extraction electrodes, may increase the base portion extraction electrodes in thickness than the driving electrodes without cost increase for thickening the base portion extraction electrodes.

A tuning-fork type crystal vibration piece according to yet another aspect of the second embodiment further includes a junction portion protruding from the other end surface of the base portion. This junction portion includes a basal end part and an extended part. The basal end part is protruding from a central line on the other end surface of the base portion between positions at which the paired vibration arm portions are juxtaposed. The extended part is extending from the basal end part toward one side in the arm-juxtaposed direction. This junction portion, with these parts thus arranged, has an L-like shape in plan view. On a surface of the basal end part is formed a first junction extraction electrode for external use to which one of the paired base portion extraction electrodes for external use is extracted. A first metal bump is formed in an upper part of the first junction extraction electrode for external use. On a surface of the extended part is formed a second junction extraction electrode for external use to which the other one of the paired base portion extraction electrodes for external use is extracted. A second metal bump is formed in an upper part of the second junction extraction electrode for external use. The first metal bump is greater in size in plan view than the second metal bump.

A crystal vibration unit is given as an example, in which the crystal vibration piece is supported with the metal bumps in a cantilever manner in the package, and the junction portion has an L-like shape in plan view. According to this aspect wherein the first metal bump is greater in size in plan view than the second metal bump, and the first metal bump is formed at the basal end part, the crystal vibration piece may maintain generally well-balanced vibrations despite the base portion extraction electrodes greater in thickness than the driving electrodes on the base portion.

A tuning-fork type crystal vibration piece according to yet another aspect of the second embodiment is characterized in that the edge-of-arm extraction electrodes have surface layers plated with a metal, metal bumps are formed in upper parts of the base portion extraction electrodes for external use or upper parts of the junction extraction electrodes for external use, and the metal bumps have surface layers plated with the same metal as the plating metal of the edge-of-arm extraction electrodes.

The frequency-adjusting electrode portion for weight may be formed by plating on the surface layers of the edge-of-arm extraction electrodes. According to this aspect wherein the surface layers of the metal bumps are plated with the same metal as the plating metal of the edge-of-arm extraction electrodes, the surface layers of the metal bumps may be metal-plated in the step of forming by plating the frequency-adjusting electrode portion for weight. Thus, the metal bumps may be more thickened than the driving electrodes simultaneously with the formation of the frequency-adjusting electrode portion for weight without cost increase for thickening the metal bumps.

A tuning-fork type crystal vibration piece according to yet another aspect of the second embodiment is characterized in that the base portion has side parts symmetrically and equally shaped in plan view relative to the central line between positions at which the paired vibration arm portions are juxtaposed, and the base portion extraction electrodes are electrically insulated from each other and formed in an equal thickness on substantially the whole front and back surfaces of the base portion.

According to this aspect, the crystal vibration piece may maintain well-balanced vibrations the thickened base portion extraction electrodes. As a result, a piezoelectric vibration piece may be obtainable that maintain required performance characteristics over a long period of time.

Figure 10:
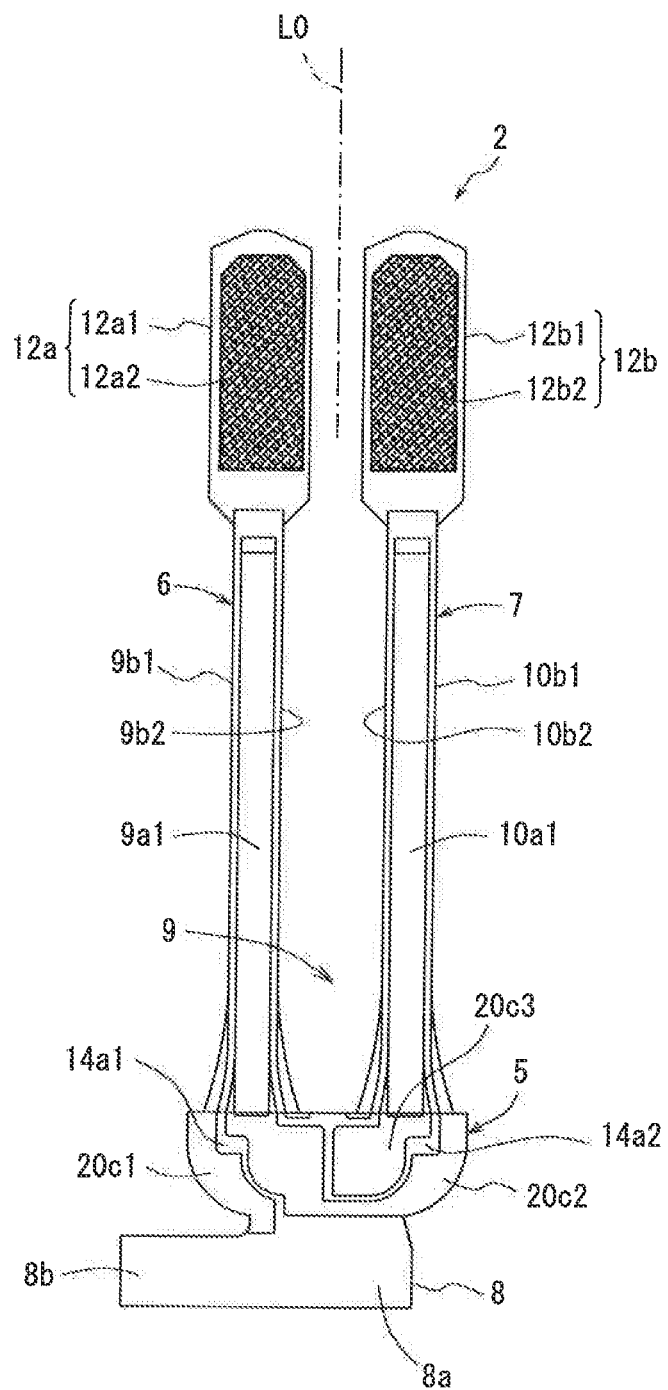
FIG. 10 is a front surface view of a tuning-fork type crystal vibration piece according to a second embodiment of the invention.
Figure 11:
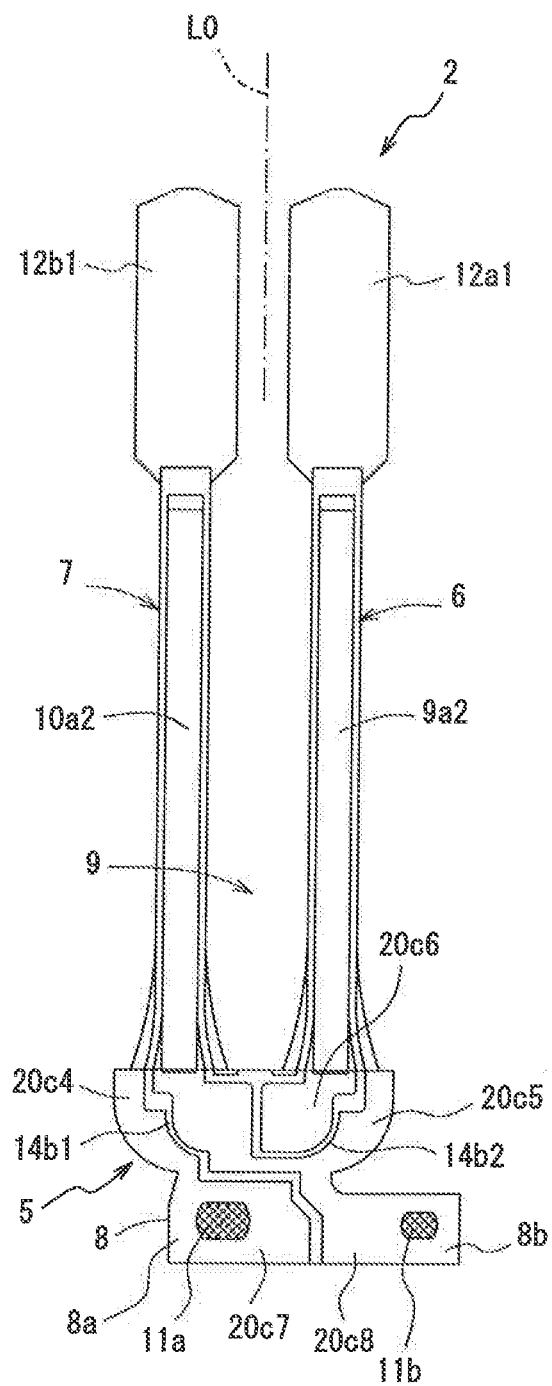
FIG. 11 is a back surface view of the tuning-fork type crystal vibration piece illustrated in FIG. 10.
Figure 12:
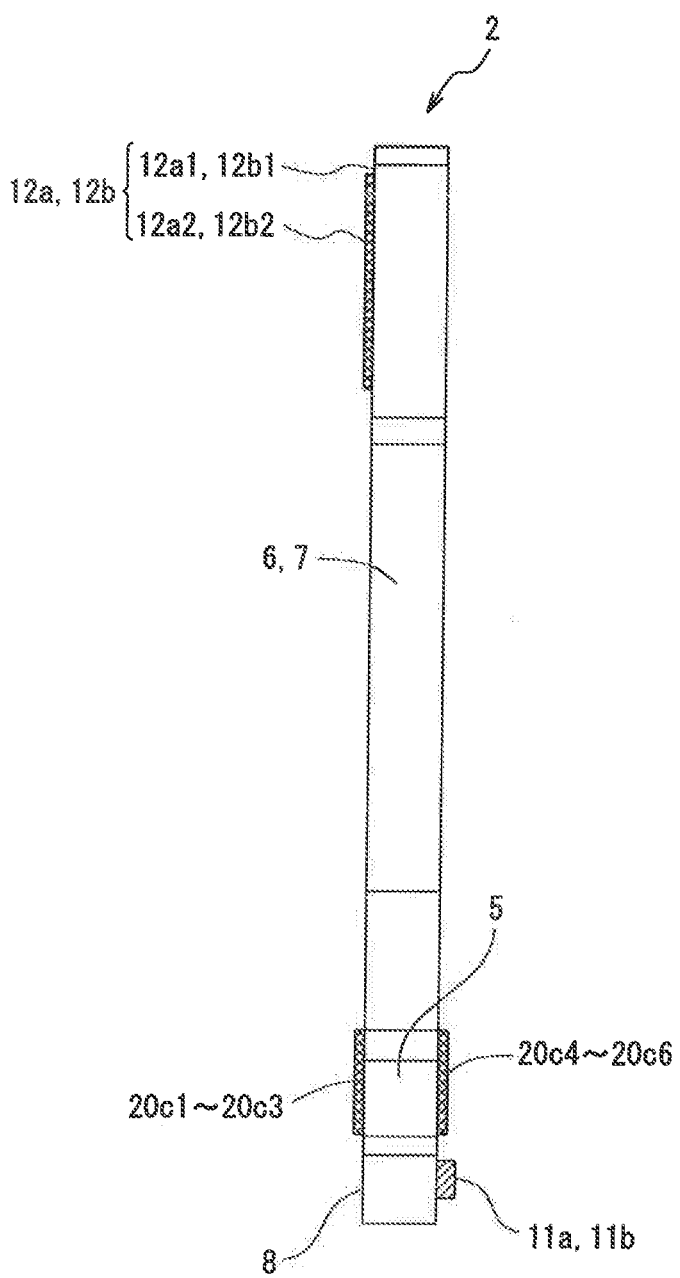
FIG. 12 is a side surface view of the tuning-fork type crystal vibration piece illustrated in FIG. 10.

The second embodiment is hereinafter described in detail referring to FIGS. 10 to 12. FIG. 10 is a front surface view of the tuning-fork type crystal vibration piece according to the second embodiment. FIG. 11 is a back surface view of the tuning-fork type crystal vibration piece illustrated in FIG. 10. FIG. 12 is a side surface view of the tuning-fork type crystal vibration piece illustrated in FIG. 10. In these drawings, the same or similar structural elements are illustrated with the same reference signs, and detailed description of such structural elements may be omitted to avoid redundancy.

A crystal vibration piece 2 illustrated in these drawings is described below. A base portion extraction electrode for external use 20c4 is extracted to the back surface of the basal end part 8a of the junction portion 8 to form a first junction extraction electrode for external use 20c7. A first metal bump 11a elliptical in plan view is formed in an upper part of the first junction extraction electrode for external use 20c7. A base portion extraction electrode for external use 20c5 is extracted to the back surface of the extended part 8b of the junction portion 8 to form a second junction extraction electrode for external use 20c8. A second metal bump 11b elliptical in plan view is formed in an upper part of the second junction extraction electrode for external use 20c8. The shapes of first and second metal bumps 11a and 1b, instead of elliptical in plan view, may be circular in plan view.

Similarly to the first embodiment, the first metal bump 11a is formed on the basal end part 8a at a position substantially at the center in the direction in which the first and second vibration arm portions 6 and 7 are juxtaposed. Specifically, the first metal bump 11a is formed at a position slightly displaced from the central position toward one side in the arm-juxtaposed direction. The second metal bump 11b is formed on the extended part 8b at a position slightly displaced from the central position toward the other side in the arm-juxtaposed direction. The first metal bump 11a is greater in size in plan view than the second metal bump 11b. As a result, the crystal vibration piece 2 may maintain generally well-balanced vibrations.

On edge sides of the first and second vibration arm portions 6 and 7 are formed edge-of-arm extraction electrodes 12a and 12b by which the driving electrodes are partly common-connected.

The edge-of-arm extraction electrodes 12a and 12b include lower edge-of-arm extraction electrode portions 12a1 and 12b1, and frequency-adjusting electrode portions for weight 12a2 and 12b2 formed in a partial region on surfaces of the lower edge-of-arm extraction electrode portions 12a1 and 12b1. These edge-of-arm extraction electrodes 12a and 12b are greater in thickness in its entirety than the driving electrodes.

The lower edge-of-arm extraction electrode portions 12a1 and 12b1 are formed on front and back surfaces of the first and second vibration arm portions 6 and 7. The frequency-adjusting electrode portions for weight 12a2 and 12b2 are formed in a partial region of the lower edge-of-arm extraction electrode portions 12a1 and 12b1 on the surfaces of the first and second vibration arm portions 6 and 7.

The base portion extraction electrodes 20c1 to 20c6 are substantially equal in thickness to the edge-of-arm extraction electrodes 12a and 12b. The frequency-adjusting electrode portions for weight 12a2 and 12b2 are formed of a metal film by plating in a partial region of the lower edge-of-arm extraction electrode portions 12a1 and 12b1.

In the edge-of-arm extraction electrodes 12a and 12b according to the second embodiment, the lower edge-of-arm extraction electrode portions 12a1 and 12b1 are decreased in thickness, and the frequency-adjusting electrode portions for weight 12a2 and 12b2 are increased in thickness. Instead, the lower edge-of-arm extraction electrode portions 12a1 and 12b1 may be increased in thickness, while the frequency-adjusting electrode portions for weight 12a2 and 12b2 may be decreased in thickness. The lower edge-of-arm extraction electrode portions 12a1 and 12b1 and the frequency-adjusting electrode portions for weight 12a2 and 12b2 may be both increased in thickness as far as these electrode portions are, on the whole, substantially equal in thickness to the base portion extraction electrodes 20c1 to 20c6. Alternatively, the edge-of-arm extraction electrodes 12a and 12b may be formed in a substantially equal thickness to the driving electrodes, while the frequency-adjusting electrode portions for weight 12a2 and 12b2 alone may be decreased in thickness.

According to the second embodiment, the frequency-adjusting electrode portions for weight 12a2 and 12b2 are formed on the front-surface sides of the first and second vibration arm portions 6 and 7, however, may be formed on their back-surface sides.

To drive the crystal vibration piece 2 and enable its frequency to reach a required frequency, the frequency-adjusting electrode portions for weight 12a2 and 12b2 of the edge-of-arm extraction electrodes 12a and 12b are decreased in mass by laser beam scan or ion etching for fine frequency adjustments. Optionally, the lower edge-of-arm extraction electrode portions 12a1 and 12b1 may in increased in thickness for fine frequency adjustments, including the frequency-adjusting electrode portions for weight 12a2 and 12b2.

In view of prevention of electric discharge-induced electrostatic destruction, it should be understood that the base portion extraction electrodes 20c1 to 20c6 may be thicker than the edge-of-arm extraction electrodes 12a and 12b.

In the crystal vibration piece 2 according to the second embodiment thus characterized, the base portion extraction electrodes 20c1 to 20c6 on the base portion 5 are at least substantially equal in thickness to the edge-of-arm extraction electrodes 12a and 12 as illustrated in FIG. 12. The base portion extraction electrodes 20c1 to 20c6, on the other hand, are greater in thickness than the driving electrodes 9b1, 9b2, 10b1, and 10b2 on the front and back main surfaces of the vibration arm portions 6 and 7. The base portion extraction electrodes 20c1 to 20c6 are formed in an equal thickness on almost the whole front and back surfaces of the base portion 5 except for the discrete insulation lines 14a1, 14a2, 14b1, and 14b2.

According to the second embodiment, the base portion extraction electrodes 20c1 to 20c6 on the base portion 5 are more thickened than the driving electrodes 9b1, 9b2, 10b1, and 10b2 on the front and back main surfaces of the vibration arm portions 6 and 7. The base portion extraction electrodes 20c1 to 20c6 may be, therefore, enhanced in mechanical strength.

The base portion extraction electrodes 20c1 to 20c6 may be thinly formed on the base portion 5 and shortly spaced from one another with the discrete insulation lines 14a1, 14a2, 14b1, and 14b2 interposed therebetween. In the event of electric discharge at angular parts, however, the base portion extraction electrodes 20c1 to 20c6 thus enhanced in mechanical strength may be effectively prevented from undergoing electrostatic destruction.

According to the second embodiment, while the junction portion 8 has an L-like shape in plan view, the first metal bump 11a is greater in size in plan view than the second metal bump 11b, and the first metal bump 11a is formed substantially on the central line between the positions at which the paired first and second vibration arm portions 6 and 7 are juxtaposed.

These structural advantages may allow the whole crystal vibration piece 2 to achieve generally well-balanced vibrations.

The second embodiment is further characterized in that the base portion 5 has side parts symmetrical in plan view relative to the central line between the positions at which the paired first and second vibration arm portions 6a and 7 are juxtaposed, and the base portion extraction electrodes 20c1 to 20c6 are formed in a substantially equal thickness on substantially the whole front and back surfaces of the base portion 5. Therefore, while the base portion extraction electrodes 20c1 to 20c6 are increased in thickness to prevent electrostatic destruction, the crystal vibration piece 2 may keep well-balanced vibrations and achieve stable and long-term performance characteristics.

In the edge-of-arm extraction electrodes 12a and 12b, the lower edge-of-arm extraction electrode portions 12a1 and 121 may be thin films each having a chrome (Cr) under layer and a gold (Au) upper layer by photolithography. Further, the frequency-adjusting electrode portions for weight 12a2 and 12b2 may be thick films coated with gold (AU) by electrolytic plating and increased in mass for frequency adjustments.

A process for thickening the extraction electrodes 20c1 to 20c6 is hereinafter described.

The outer shapes of the crystal vibration pieces 2 are formed by processing a crystal wafer using photolithography, and necessary electrodes are formed on the crystal vibration pieces 2. Then, the crystal vibration pieces 2 are broken off and separated from the crystal wafer into individual pieces.

The electrodes of the vibration arm portions 6 and 7 of the crystal vibration piece 2 specifically have a thin-layered structure having a Cr under layer and an Au upper layer. The frequency-adjusting electrode portions for weight 12a2 and 12b2 formed in a partial region of the lower edge-of-arm extraction electrode portions 12a1 and 12b1 of the edge-of-arm extraction electrodes 12a and 12b are formed in the form of thick films by electrolytic plating (Au). The metal bumps 11a and 11b formed on the junction portion 8 are also formed in the form of thick films by electrolytic plating (Au).

After the base portion extraction electrodes 20c1 to 20c6 are formed on the base portion 5 in the same thin-film structure as the driving electrodes, the base portion extraction electrodes 20c1 to 20c6 have their surface layers plated by electrolytic plating in the step of forming the frequency-adjusting electrode portions for weight 12a2 and 12b2 in the upper parts of the lower edge-of-arm extraction electrode portions 12a and 12b 1 of the edge-of-arm extraction electrodes 12a and 12b. The base portion extraction electrodes 20c1 to 20c6 thus metal-plated are substantially equal in thickness to the edge-of-arm extraction electrodes 12a and 12b.

The edge-of-arm extraction electrode 12a is connected to the driving electrodes 9b1 and 9b2 on the side surfaces of the first vibration arm portion 6. The edge-of-arm extraction electrode 12b is connected to the driving electrodes 10b1 and 10b2 on the side surfaces of the second vibration arm portion 7.

The frequency-adjusting electrode portions for weight 12a2 and 12b2 of the edge-of-arm extraction electrodes 12a and 12b may be formed in an approximately few-μm thickness, or preferably in an approximately 2 to 8 μm thickness. The first and second metal bumps 11a and 11b may be formed in an approximately few-μm thickness, or preferably in an approximately 7 to 15 μm thickness.

In this instance, the extraction electrodes 20c1 to 20c on the base portion 5 before plating are thin films substantially equal in thickness to the driving electrodes. Preferably, the extraction electrodes 20c1 to 20c may be thickened to be substantially equal in thickness to the edge-of-arm extraction electrodes 12a and 12b in the electrolyte plating step for the frequency-adjusting electrode portions for weight 12a2 and 12b2.

According to the second embodiment, the base portion extraction electrodes 20c1 to 20c6 are greater in thickness than the driving electrodes and thereby enhanced in mechanical strength. While the base portion extraction electrodes 20c1 to 20c6 may be reduced in width and/or narrowly spaced from one another, electric discharge, if occurred among the base portion extraction electrodes 20c1 to 20c6 on the base portion 5, may be prevented from leads to electrostatic destruction of the base portion extraction electrodes 20c1 to 20c6.

In a crystal vibration unit (piezoelectric vibrator) wherein the crystal vibration piece 2 is supported in the package in a cantilever manner on the base-portion-5 side, the crystal vibration piece 2 may be supported with a greater strength by increasing in thickness the base portion extraction electrodes 20c1 to 20c6 on the base portion 5, and the vibrations of the vibration arm portions 6 and 7 may be effectively stabilized.

As thus far described, the second embodiment may be advantageous in that the base portion extraction electrodes 20c1 to 20c6 on the front and back surfaces of the base portion 5 are greater in thickness than the driving electrodes 9a1, 9b1, 10b1, and 10b2 on the front and back surfaces of the base portion 5 and thereby enhanced in mechanical strength. This may avoid that electric discharge, if occurred among the base portion extraction electrodes 20c1 to 20c6 on the base portion 5, leads to electrostatic destruction of the base portion extraction electrodes 20c1 to 20c6.

According to the second embodiment, the first and second metal bumps 11a and 11b are formed on the first and second junction extraction electrodes for external use 20c7 and 20c8 of the junction portion 8. Optionally, the junction portion 8 may be omitted, and the first and second metal bumps 11a and 11b may be respectively formed on the base portion extraction electrodes 20c4 and 20c5.

Third Embodiment

Figure 13:
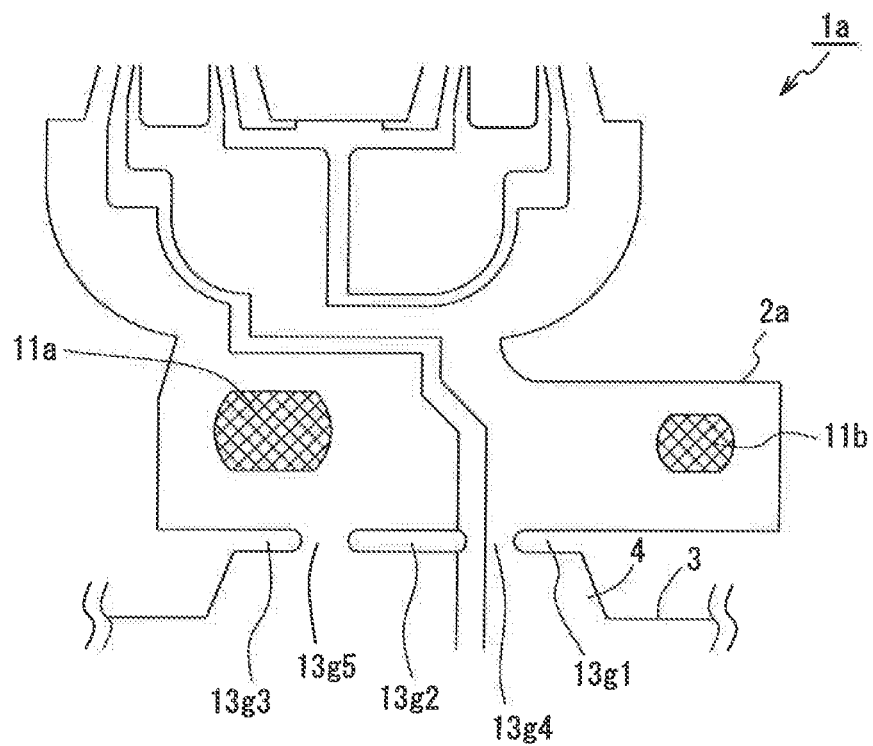
FIG. 13 is a partly enlarged plan view of a conventional piezoelectric wafer.

Crystal wafers may have slits formed in their coupling portions except for parts of the coupling portions in the width direction to facilitate the removal of crystal vibration pieces. Referring to FIG. 13, a crystal wafer with such slits is described.

The crystal wafer has crystal vibration pieces 2a with metal bumps 11a and 11b, frame portions 3 supporting the crystal vibration pieces 2a, and coupling portions 4 that couple the crystal vibration pieces 2a to the frame portions 3. The coupling portions 4 each have, for easy removal of the crystal vibration piece, slits 13g1 to 13g3 penetrating through the front and back surfaces of the coupling portion 4, and slit-less bridges 13g4 and 13g5 in parts of the coupling portion 4 in the width direction among the slits 131 to 13g3.

A test was carried out, in which an external force, such as an impact load, was applied to the crystal vibration pieces removed from the crystal wafer. The test demonstrated vibration frequency drift in some of the crystal vibration pieces. This phenomenon was studied to find out its causation.

The test confirmed some cracks originated from the bridges 13g4 and 13g5 in some of the crystal vibration pieces 2a when broken off from the frame portions 3. The detected cracks were spreading as far as the break-off end parts or near regions of the crystal vibration pieces 2a.

When such a crystal vibration piece with cracks spreading as far as its break-offend part was under an impact, such as vibrations, the impact may cause the cracks at the break-off end part to further spread around the metal bumps. The vibration frequency drift was observed in many of the crystal vibration pieces in which the cracks had spread around the metal bumps.

The third embodiment provides for a crystal wafer that may prevent cracks at break-off end parts or near regions in crystal vibration pieces from further spreading around metal bumps under an external force such as an impact load.

A crystal wafer according to an aspect of the third embodiment, though essentially configured similarly to the crystal wafer according to the first embodiment, is further characterized in that slits that facilitate the removal of the crystal vibration pieces are formed in each coupling portion along the width direction except for bridges formed in parts of the coupling portion in the width direction, and ends of the bridges in the width direction are distant from the metal bumps with no overlap with the metal bumps in a direction perpendicular to the width direction.

According to this aspect, the ends of the bridges in the width direction are distant from metal bumps with no overlap with the metal bumps in a direction perpendicular to the width direction. This structural feature may prevent, in the crystal vibration piece separated from the frame portion of the crystal wafer, outspread of any cracks generated at the break-off end part when an external force, such as an impact load, is imposed on the crystal vibration piece. The third embodiment, therefore, may prevent any vibration frequency drift when the crystal vibration piece separated from the crystal wafer is under any impact from outside.

The impact possibly imposed on the broken-off crystal vibration piece may be, for example, a vibratory pressure at the time of ultrasonic bonding of the metal bumps to electrode pads in the package of a crystal vibration device when the separated crystal vibration piece is mounted in the package.

In the crystal vibration pieces further miniaturized to desirably increase the number of crystal vibration pieces that can be obtained from one crystal wafer, the bridges and the metal bumps may be more closely located. Yet, the cracks at the break-offend parts are unlikely to spread around the metal bumps according to the third embodiment. Therefore, it may be advantageous to further miniaturize each crystal vibration piece to obtain more crystal vibration pieces from one crystal wafer.

According to another aspect of the third embodiment, parts of the bridges largest in width are not overlapping with the metal bumps in the perpendicular direction.

According to this aspect, even if the bridges are bent in the perpendicular direction, the parts of the bridges largest in width are not overlapping with the metal bumps in the perpendicular direction. This structural advantage may effectively prevent that any external force, such as an impact load, applied to the crystal vibration piece causes the cracks at the break-off part to further spread around the metal bumps.

In case the bridges are, for example, bent in the perpendicular direction and thereby changes in width, the crystal vibration piece to be separated from the frame portion may be broken off at the narrowest part of the coupling portion having a poor strength. However, the point of origin of cracks is not necessarily the narrowest part of the coupling portion. Therefore, the parts of the bridges largest in width are preferably not overlapping with the metal bumps in the perpendicular direction.

According to yet another aspect of the third embodiment, the bridges are distant from the metal bumps in the perpendicular direction by a dimension greater than or equal to 10 μm.

When the crystal vibration piece is separated from the frame portion, the cracks originated from the bridges may spread to the break-off end part after the crystal vibration piece is broken off According to this aspect wherein the bridges are distantly spaced from the metal bumps in the perpendicular direction by a dimension greater than or equal to 10 μm, the both ends of the break-off end part in the width direction may be far enough from the metal bumps to make it difficult for the cracks to reach the metal bumps.

According to yet another aspect of the third embodiment, the bridges are formed at a central position in the width direction between positions at which the metal bumps are juxtaposed.

According to this aspect, the cracks at the break-off end part of the crystal vibration piece may further spread around neither one of the metal bumps. Therefore, it may be advantageous to further miniaturize each crystal vibration piece to obtain more crystal vibration pieces from one crystal wafer.

A crystal vibration piece according to yet another aspect of the third embodiment has a pair of vibration arm portions, a junction portion joined to an external element, and a base portion having the pair of vibration arm portions juxtaposed on one end surface thereof and the junction portion formed on the other end surface thereof opposite to the one end surface. The paired vibration arm portions are protruding in parallel to each other from the one end surface of the base portion. The junction portion has a basal end part formed at a middle position on the other end surface of the base portion in a direction in which the paired vibration arm portions are juxtaposed, and the basal end part has a first metal bump formed thereon. The junction portion further has an extended part extending from the basal end part toward one side in the width direction of the coupling portion, and the extended part has a second metal bump formed thereon. The junction portion, with these parts thus arranged, has an L-like shape in plan view. The first metal bump is greater in size in plan view than the second metal bump.

According to this aspect, the basal end part of the junction portion is formed at a middle in the direction in which the paired vibration arm portions are juxtaposed, and the first metal bump is greater in size in plan view than the second metal bump. These structural advantages may allow the crystal vibration piece separated from the frame portion to achieve generally well-balanced vibrations.

Figure 14:
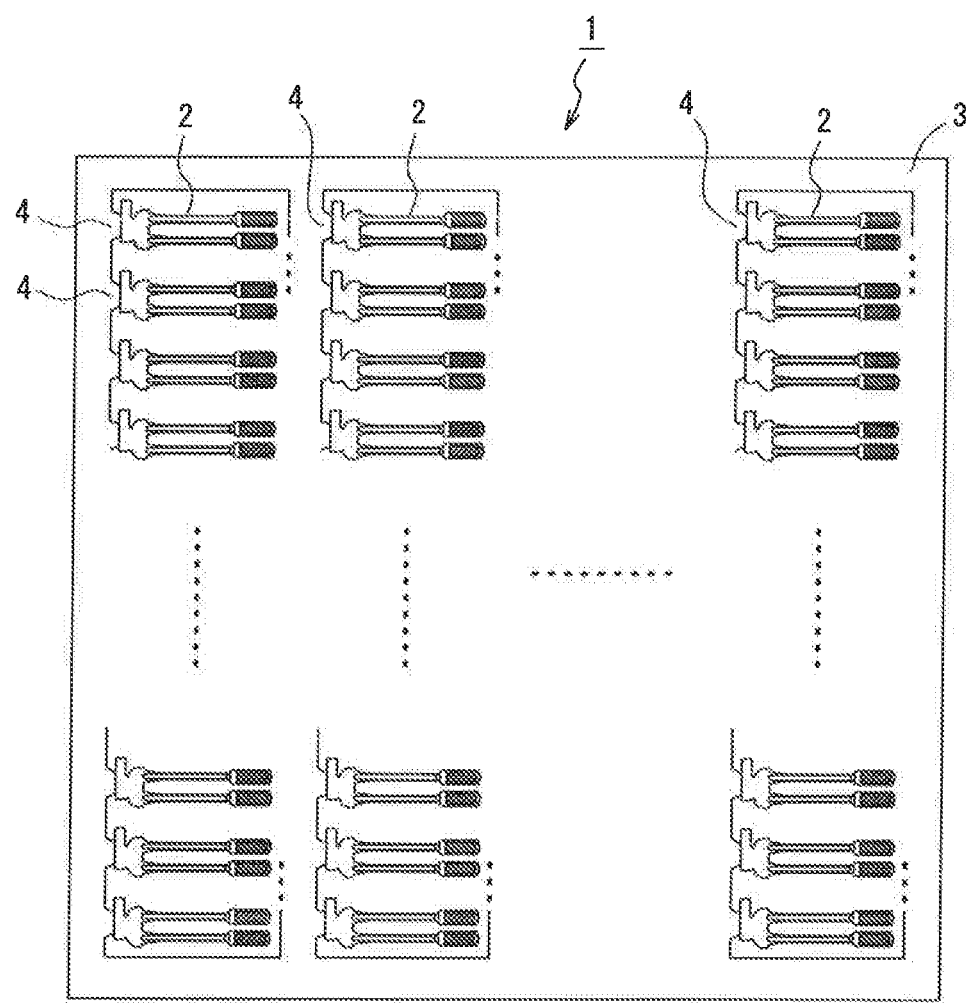
FIG. 14 is an overall view of a crystal wafer according to a third embodiment of the invention.
Figure 15A:
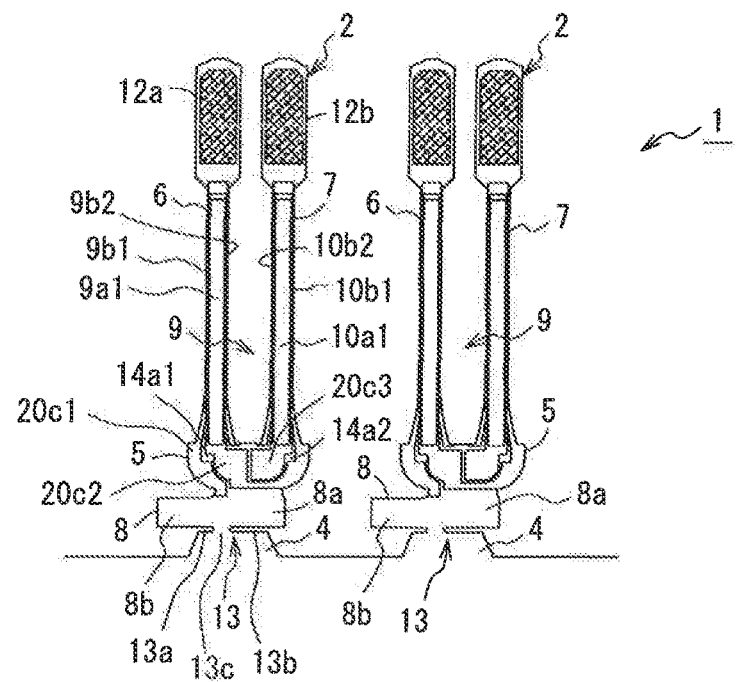
FIG. 15a is a partly enlarged view of the front-surface side of the crystal wafer illustrated in FIG. 14.
Figure 15B:
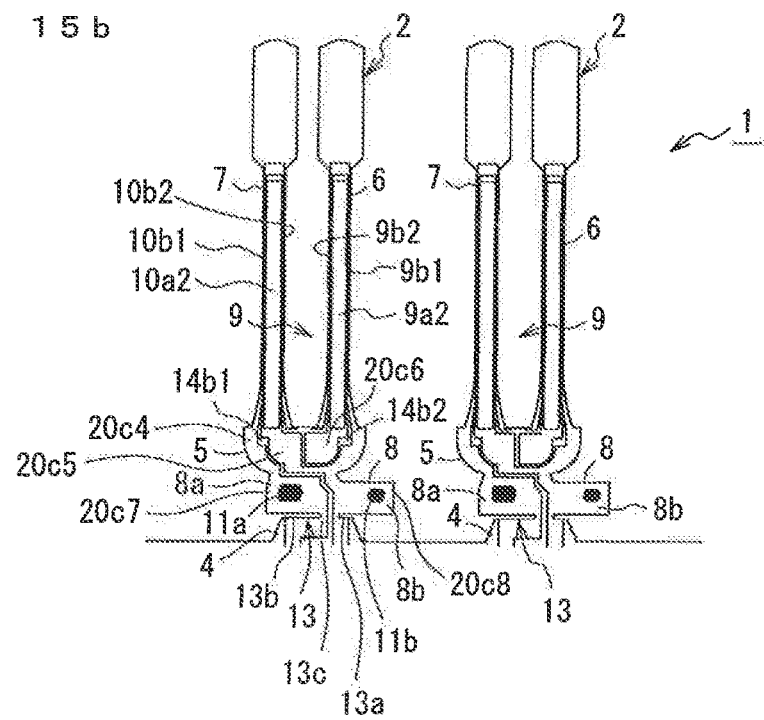
FIG. 15b is a partly enlarged view of the back-surface side of the crystal wafer illustrated in FIG. 14.
Figure 16:
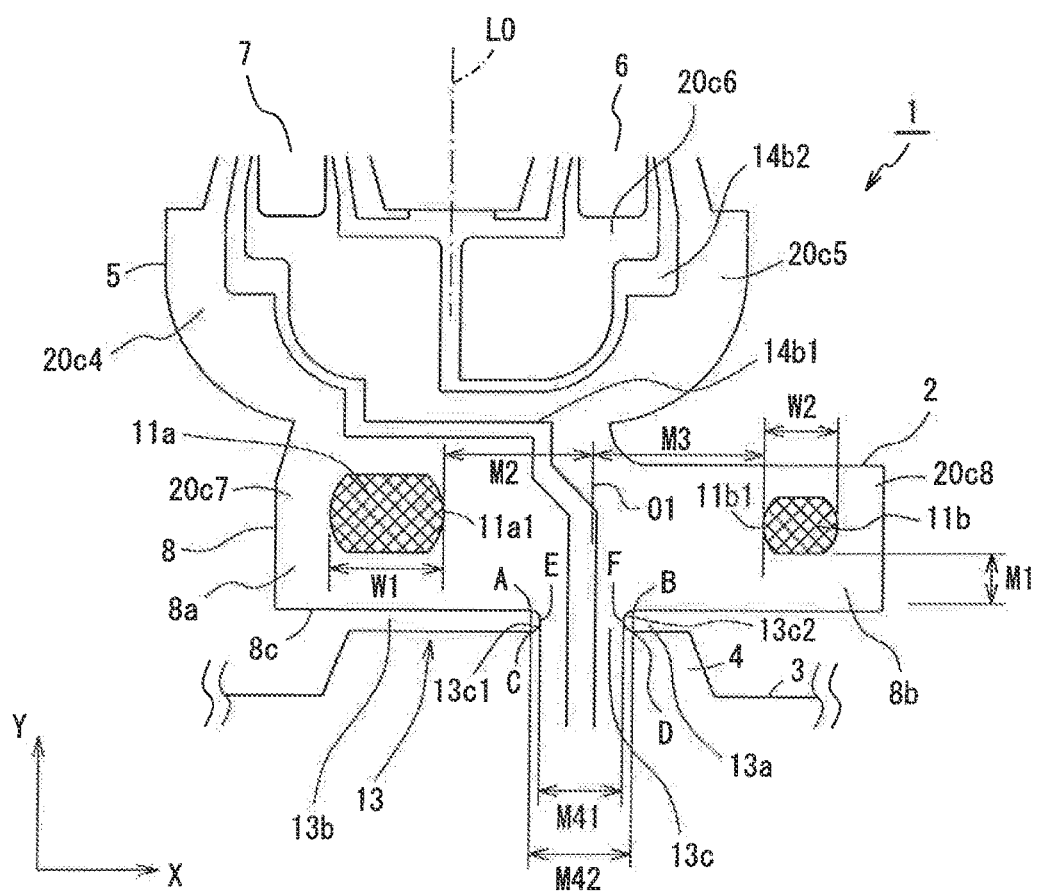
FIG. 16 is a partly enlarged back surface view of the crystal wafer illustrated in FIG. 14.

The crystal wafer according to the third embodiment is described referring to FIGS. 14 to 16. In these drawings, the same or similar structural elements are illustrated with the same reference signs, and detailed description of such structural elements may be omitted to avoid redundancy.

A reference sign L0 in the drawings represents a central line between positions at which the first and second vibration arm portions 6 and 7 are juxtaposed. This central line L0 is extending downward along a direction in which these vibration arm portions are protruding in a direction opposite to the arm-protruding direction.

Of the extraction electrodes 20c1 to 20c6, the extraction electrodes 20c4 and 20c5 on the back-surface side of the base portion 5 are extracted from the base portion 5 to the junction portion 8, coupling portion 4, and frame portion 3. The extraction electrodes 20c4 and 20c5 thus extracted serve as extraction electrodes 20c7 and 20c8 for applying voltages of one and the other polarities.

The extraction electrodes 20c1 to 20c8 are electrically insulated from one another by the discrete insulation lines 14a1, 14a2, 14b1, and 14b2.

Of the extraction electrodes 20c1 to 20c8, the extraction electrodes 20c1, 20c3, and 20c5 may be referred to as base portion extraction electrodes for connection by which the driving electrodes are partly common-connected, and the extraction electrodes 20c1, 20c4, and 20c6 may be referred to as base portion extraction electrode for external use to which the driving electrodes are partly externally extracted, collectively, as the extraction electrodes 20c1 to 20c6. The extraction electrode 20c4, when extracted to the junction portion 8, may be referred to as a junction extraction electrode for external use 20c7. The extraction electrode 20c5, when extracted to the junction portion 8, may be referred to as a junction extraction electrode for external use.

The junction portion 8 has a basal end part 8a and an extended part 8b. The basal end part 8a is slightly protruding from the center position on the other end surface of the base portion 5 in the direction in which the first and second vibration arm portions 6 and 7 are juxtaposed. The extended part 8b is extending from the basal end part 8a toward one side in the direction in which the first and second vibration arm portions 6 and 7 are juxtaposed. The junction portion 8, with these parts thus arranged, has an L-like shape in plan view with respect to the base portion 5. Referring to the drawing, the basal end part 8a of the junction portion 8 has a protruding length with respect to the base portion smaller than the other. The junction portion 8 may have an L-like shape in plan view in which the basal end part 8a has a greater protruding length.

The first metal bump 11a having an elliptical shape in plan view is formed on the extraction electrode 20c7 of the basal end part 8a of the junction portion 8. The second metal bump 11b having an elliptical shape in plan view is formed on the extraction electrode 20c8 of the extended part 8b of the junction portion 8. These metal bumps are formed by electrolytic plating. The shapes of the first and second metal bumps 11a and 11b may be otherwise, for example, a circular shape in plan view. A preferable example of the electrolytic plating may be gold plating, which is, however, a non-limiting example.

As for the extraction electrodes 20c7 and 20c8, the driving electrodes of the crystal vibration piece 2 are extracted to the frame portion 3 through the junction portion 8 and the coupling portion 4, so that an external voltage applied to the first and second metal bumps 11a and 11b is applied to the driving electrodes of the crystal vibration piece 2. Also, the driving electrodes of the crystal vibration piece 2 are thus extracted to apply the voltage for frequency adjustment to these driving electrodes at the time of frequency adjustments before the crystal vibration piece 2 is broken off at the coupling portion 4.

When the crystal vibration piece 2 is mounted in the crystal vibration device not illustrated in the drawings, the first and second metal bumps 11a and 11b are bonded by ultrasonic bonding to a pair of opposing electrode pads on a part different in level or bottom surface of a package in the crystal vibration device.

The first metal bump 11a is formed at a position substantially at the center in the direction in which the first and second vibration arm portions 6 and 7 are juxtaposed. Specifically, the first metal bump 11a is formed at a position slightly displaced from the center position in the arm-juxtaposed direction toward one side in the arm-juxtaposed direction than. The second metal bump 11b is formed at a position displaced from the center position in the direction in which the first and second vibration arm portions 6 and 7 are juxtaposed toward the other side in the arm-juxtaposed direction.

Each of the driving electrodes and the extraction electrodes may be, fore example, a thin film including a chrome layer and a metal layer formed by vapor deposition. These thin films are subjected to metal etching after they are formed on the whole surface of the crystal wafer 1 by, for example, vapor deposition.

The frequency-adjusting electrode portions for weight 12a2 and 12b2, each having a metal film formed thereon by electrolyte plating, are formed on the surfaces of the first and second vibration arm portions 6 and 7. With the purpose of driving the crystal vibration piece 2 and adjusting its frequency to reach a required frequency, the frequency-adjusting electrode portions for weight 12a2 and 12b2 are decreased in mass by laser beam scan or ion etching for fine frequency adjustments. The coupling portion 4 has a break-off part 13. This part is a section of the coupling portion 4 in the width direction along the interface between the coupling portion 4 and the junction portion 8 of the crystal vibration piece 2. The break-off part 13 is extending across the entire width of the coupling portion 4 in the width direction The break-off part 13 has, on its both side-surface sides, two grooved slits 13a and 13b penetrating through the front and back surfaces of the coupling portion 4. The grooved slits 13a and 13b are, however, not formed in a part of the coupling portion 4 in the width direction. The beak-off part 13 further has a bridge 13c, which is a slit-less part in the width direction, having a flat surface continuous to the front and back surfaces of the coupling portion.

According to the third embodiment, the slits 13a and 13b are penetrating through the front and back surfaces of the coupling portion 4. Instead, the slits may be non-penetrating grooved slits.

The crystal wafer 1 according to the third embodiment is further described referring to FIG. 16. In the drawing, a reference sign X represents the width direction of the coupling portion 4, and a reference sign Y represents a direction perpendicular to the width direction. In the description below, the X and Y directions may be respectively used to refer to the width direction and the perpendicular direction.

In this crystal wafer 1, reference signs, W1 and W2, refer to widths of the first and second metal bumps 11a and 11b, respectively. The widths W1 and W2 may preferably be 0.1 to 0.4 µm.

A reference sign, M1 refers to a distance in the perpendicular direction between an end surface 8c of the junction portion 8 closer to the coupling portion 4 and the bottom section of the first, second metal bump 11a, 11b. The distance M1 may preferably be greater than or equal to 10 µm. This distance may be rephrased as a distance between an upper edge A, B of the bridge 13c and the bottom section of the first, second metal bump 11a, 11b.

A reference sign M2 refers to a distance between a center O1 of the bridge 13c in the width direction and one end 11a1 of the first metal bump 11a in the width direction. A reference sign M3 refers to a distance between the center O1 of the bridge 13c in the width direction and one end 11b1 of the second metal bump 11b in the width direction.

The bridge 13c is formed by etching the slits 13a and 13b. Therefore, both ends 13c1 and 13c2 of the bridge 13c have a shape not straight in the perpendicular direction but bent in a recessed shape when viewed from the slits 13a and 13b. The distances M2 and M3 have a relationship expressed by M2>M42/2, M3>M42/2, where M41 is a smallest width, and M42 is a greatest width. Referring to reference signs illustrated in the drawing, A and B define an upper-side part largest in width of the bridge 13c, C and D define a lower-side part largest in width of the bridge 13c, and E and F define a part smallest in width of the bridge 13c between the upper-side part and the lower-side part largest in width.

According to the relationship between these distances, one end 11a1 of the first metal bump 11a is distantly spaced in the width direction from one end 13c1 of the bridge 13c, and one end 11b1 of the second metal bump 11b is distantly spaced in the width direction from the other end 13c2 of the bridge 13c. Accordingly, neither of one end 13c1 nor the other end 13c2 of the bridge 13c overlaps with the first metal bump 11a or the second metal bump 11b in the perpendicular direction.

The widths W1 and W2 of the first and second metal bumps 11a and 11b are not particularly limited in so far as the before-mentioned relationship is met. The widths of the bridge 13c are not particularly limited unless there is any overlap with the first and second metal bumps 11a and 11b.

In case the crystal vibration piece 2 to be separated is broken off at the break-off part 13 of the coupling portion 4, the crystal vibration piece 2 may be broken off at the smallest-in-width part (between E and F) of the bridge 13c poor in strength. Despite the fact that cracks may be likely to occur in the smallest-in-width part, cracks possibly originate from the upper part defined by A, B at the both ends 13c1 and 13c2 of the bridge 13c. In view of the possibility, the largest-in-width part (between A and B) of the bridge 13c is preferably not overlapping with the first or second metal bump 11a or 11b in the perpendicular direction.

According to this embodiment, it is necessary that neither one end 13c1 nor the other end 13c2 of the bridge 13c overlaps with each of the first metal bump 11a and the second metal bump 11b. It is necessary that neither one end 13c1 nor the other end 13c2 of the bridge 13c overlaps with each of the first metal bump 11a and the second metal bump 11b in the perpendicular direction.

According to this embodiment, the bridge 13c is located away by a few µm or more from the first and second metal bumps 11a and 11b in the perpendicular direction. Therefore, the bridge 13c is not overlapping with these metal bumps in the perpendicular direction. However, the separation distances between the both ends 13c1 and 13c2 of the bridge 13c and the one ends 11a1 and 11b1 of the first and second metal bumps 11a and 11b should exceed 0 µm unless cracks further spread around the first, second metal bump 11a, 11b.

Figure 17A:
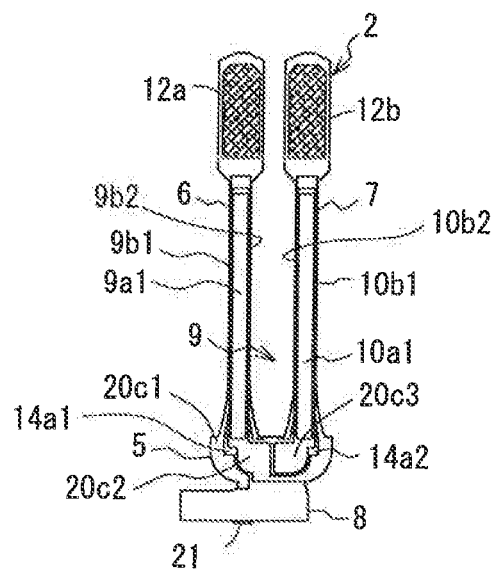
Figure 17B:
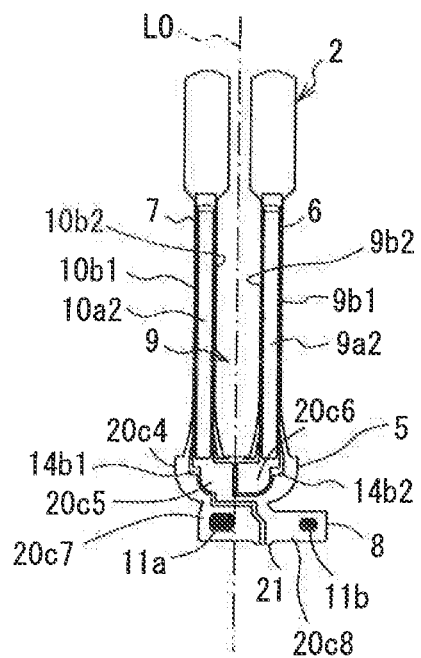
FIG. 17b is a back surface view of a crystal vibration piece separated from a frame portion of the crystal wafer illustrated in FIG. 15b.
Figure 18:
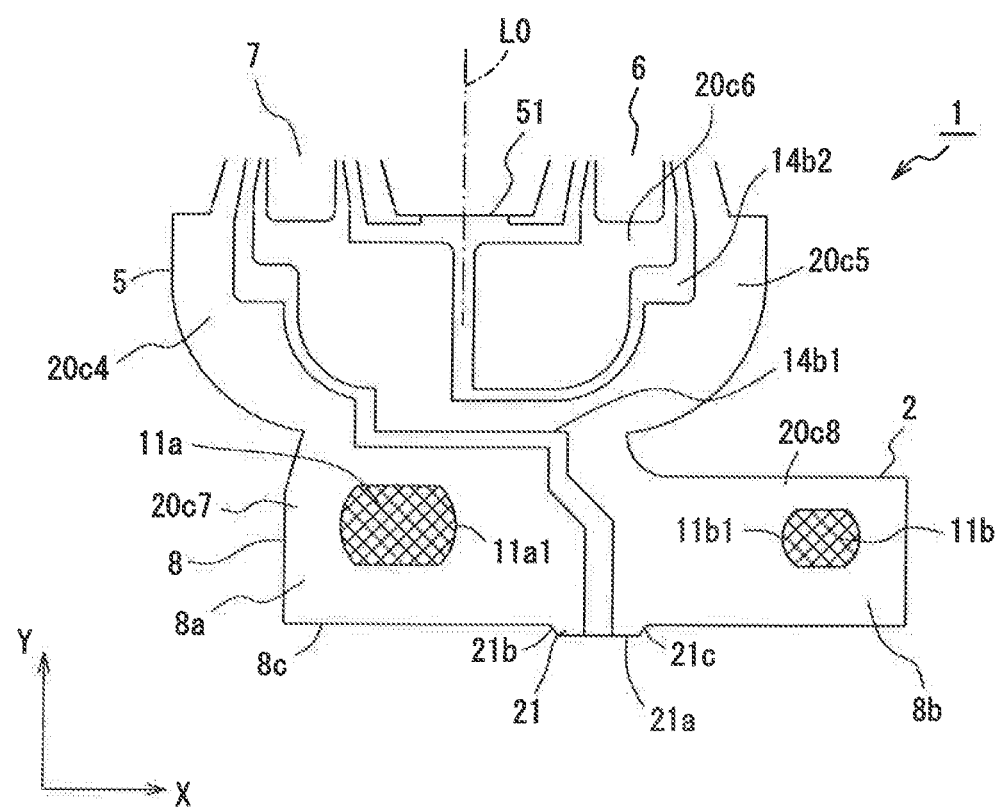
FIG. 18 is an enlarged back surface view of the crystal vibration piece illustrated in FIG. 17b.

The crystal vibration pieces 2 are broken off at the break-off part 13 and separated from the crystal wafer 1 illustrated in FIGS. 14 to 16 into individual pieces as illustrated in FIGS. 17a, 17b, and 18. FIG. 17a is a front surface view of the crystal vibration piece 2. FIG. 17b is a back surface view of the crystal vibration piece 2. FIG. 18 is an enlarged back surface view of the crystal vibration piece 2 illustrated in FIG. 17b. The crystal vibration pieces 2 coupled to the frame portions with the coupling portions 4 in the crystal wafer 1 illustrated in FIGS. 14 to 16 are broken off at the coupling portions 4, and separated into individual pieces as illustrated in FIGS. 17a, 17b, and 18.

Each of the separated crystal vibration pieces 2 has a break-off end part 21 on an end surface of the junction portion 8. The break-offend part 21 is formed from the bridge 13c when the crystal vibration piece 2 is separated from the frame portion 3. Based on the before-mentioned relationship, upper parts of both ends 21b and 21c of the break-off end part 21 in the width direction are distantly spaced in the perpendicular direction from the bottom sections of the first and second metal bumps 1a and 11b closer to the one ends 11a1 and 1b1. The both ends 21b and 21c of the break-offend part 21 thus arranged are not overlapping with the first and second metal bumps 1a and 11b in the perpendicular direction.

As illustrated in the drawing, preferably, the both ends 21b and 21c of the break-off end part 21 are not straight in the perpendicular direction but are bent in a recessed shape, and the upper parts of the both ends 21b and 21c of the break-offend part 21 are not overlapping with the first and second metal bumps 1a and 11b in the perpendicular direction. On the back surface of the break-offend part 21, the extraction electrodes 20c7 and 20c8 are extracted to the break-off end 21a.

The first and second metal bumps 11a and 11b of the crystal vibration piece 2 are bonded by ultrasonic bonding to the electrode pads in the package of the crystal vibration device. As described earlier, the first and second metal bumps 11a and 11b are distant from the break-off end part 21 with no overlap with the both ends 21b and 21c of the break-off end part 21. In the even that cracks generated in the crystal vibration piece 2 when separated from the wafer are present at and/or near the break-off end part 21, therefore, it may be prevented that the cracks further spread around the first, second metal bump 11a, 11b under any impact imposed on the crystal vibration piece at the time of ultrasonic bonding.

Figure 19:
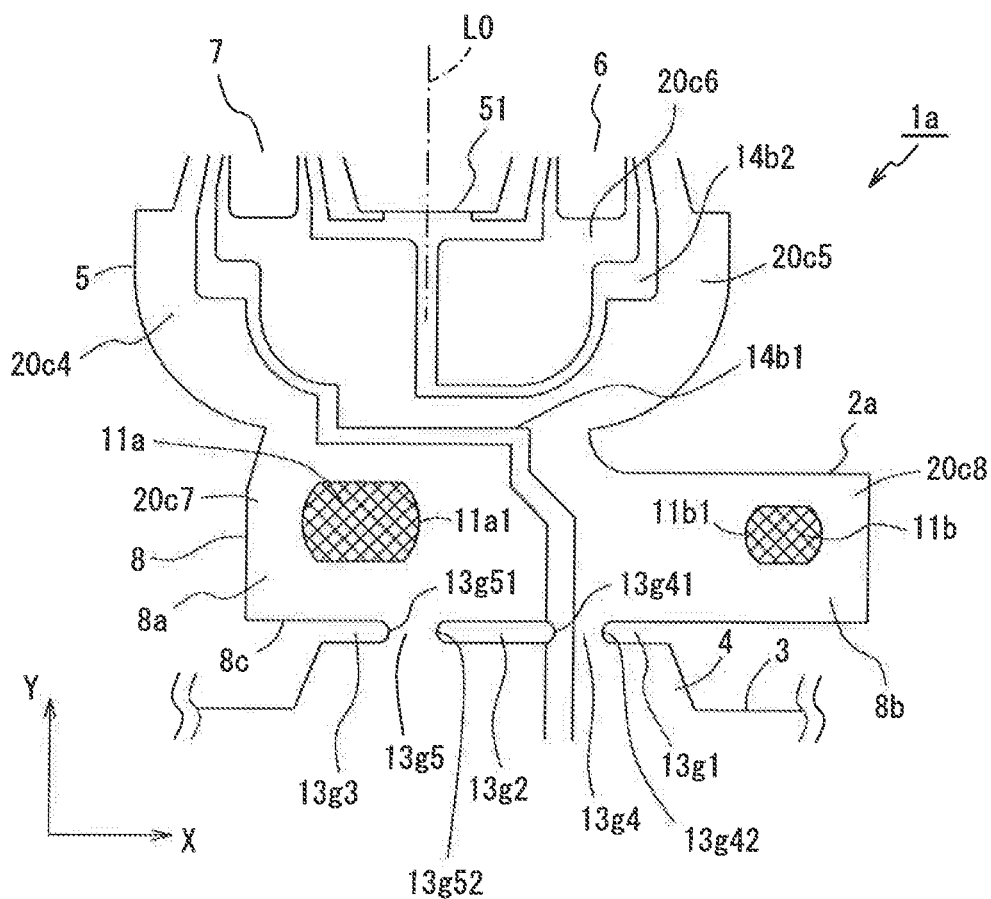
FIG. 19 is a partly enlarged back surface view of a crystal wafer according to a comparative example.

A test was carried out to measure an vibration frequency drift when an external force, such as an impact load, was applied to the crystal vibration piece 2 of FIG. 18 separated from the crystal wafer 1 of FIG. 16 and a crystal vibration piece 2a separated from a crystal wafer 1a illustrated in FIG. 19 as a comparative example (the separated crystal vibration piece 2a is not illustrated in the drawing).

Figure 20A:
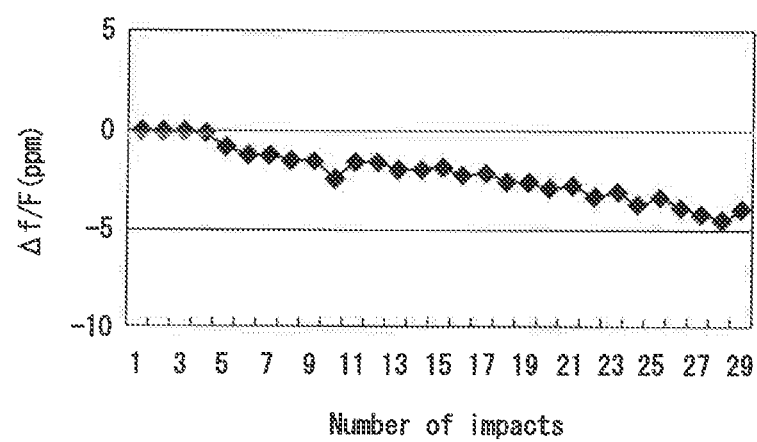
FIG. 20a is a frequency drift characteristic chart of a result obtained by imposing an impact on a crystal vibration piece separated from the crystal wafer according to the comparative example.
Figure 20B:
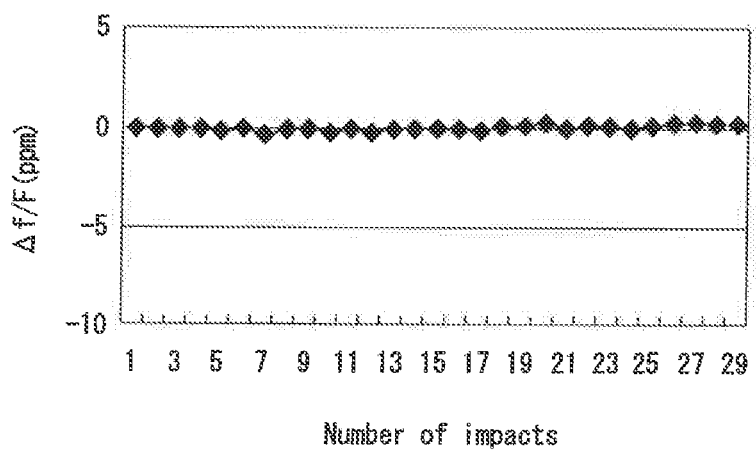
FIG. 20b is a frequency drift characteristic chart of a result obtained by imposing an impact on a crystal vibration piece separated from the crystal wafer according to the third embodiment illustrated in FIG. 14.

FIGS. 20a and 20b are frequency drift characteristic charts of the test results of the crystal vibration pieces 2 and 2a. The frequency drift characteristics of these crystal vibration pieces 2 and 2a are hereinafter described by way of comparison.

FIG. 19 is a partly enlarged back surface view of the crystal wafer 1a illustrated as a comparative example, wherein the same structural elements are illustrated with the same reference signs. The crystal wafer 1a of FIG. 19 has, as break-off parts, slits 13g1 to 13g3 and bridges 13g4 and 13g5 among the slits 13g1 to 13g3. Reference signs, 13g41 and 13g42 represent both ends of the bridge 13g4, and reference signs 13g51 and 13g52 represent both ends of the bridge 13g5.

One end 11a1 of the first metal bump 11a is located in the perpendicular direction between the both ends 13g51 and 13g52 of the bridge 13g5. The first metal bump 11a is overlapping in the Y direction with the one end 13g51 of the bridge 13g5. The second metal bump 11b is not overlapping in the Y direction with the bridge 13g4 or the bridge 13g5.

Referring to FIGS. 20a and 20b, the lateral axis indicates the number of times when an external impact is applied to the crystal vibration pieces 2 and 2a over times by tapping or dropping them, and the longitudinal axis indicates a frequency drift, Δf/F (ppm), from an vibration frequency F required in the crystal vibration piece 2.

In the crystal vibration piece 2a of the comparative example separated from the crystal wafer 1a, the vibration frequency F shifts by degrees to the minus side in proportion to an increasing number of impacts. This is the indication of outspread of the cracks around the first, second metal bump 11a, 11b in the crystal vibration piece 2a of the comparative example separated from the crystal wafer 1a.

In the piezoelectric vibration piece 2 according to this embodiment separated from the crystal wafer 1, on the other hand, the frequency drift Δf/F (ppm) from the required vibration frequency F was hardly observed regardless of an increasing number of impacts. This clearly demonstrates that outspread of the cracks around the first, second metal bump 11a, 11b is effectively prevented against an increasing number of impacts.

As described so far, in the crystal wafer 1 according to the third embodiment, an external force, such as an impact load, repeatedly applied thereto does not cause the cracks to spread around the first, second metal bump 11a, 11b, and the vibration frequency drift was hardly observed. This result may be attributed to its advantageous structural feature; no overlap between the bridge 13c of the coupling portion 4 and the first and second metal bumps 11a and 11b of the crystal vibration piece 2.

When the crystal vibration piece 2 separated from the crystal wafer 1 according to the third embodiment is later mounted in the package of the crystal vibration device, the first and second metal bumps 11a and 11b of the crystal vibration piece 2 are bonded to the electrode pads in the package by ultrasonic bonding, and a vibrational pressure at the time of ultrasonic bonding may impose an impact on the crystal vibration piece 2. Yet, it may be prevented or suppressed that any cracks generated in the break-of end part 21 of the crystal vibration piece 2 further spread around the first, second metal temp 11a, 11b. In consequence of this effect, any frequency drift from the required vibration frequency may be prevented or suppressed in the crystal vibration piece 2.

This may stabilize the vibration frequency of the separated piezoelectric vibration piece 2. When multiple piezoelectric piece 2 are to be obtained from one piezoelectric wafer 1, therefore, it may be advantageous to further miniaturize each piezoelectric piece 2 to obtain more piezoelectric pieces 2 from the crystal wafer. Thus, the third embodiment may enable further miniaturization of the piezoelectric pieces 2.

In the piezoelectric vibration piece 2 further miniaturized, the bridge 13f of the coupling portion 4 and the first and second metal bumps 11a and 11b may be more closely located, and any cracks present in the break-offend part at the time of separating the crystal vibration piece are more likely to further spread around the first, second metal bump 11a, 11b. This embodiment advantageous as described so far may effectively suppress the cracks from further spreading around the first, second metal bump 11a, 11b. This embodiment, therefore, may enable further miniaturization of the piezoelectric pieces 2, thereby increasing the number of piezoelectric pieces 2 obtainable from one piezoelectric wafer.

Figure 21:
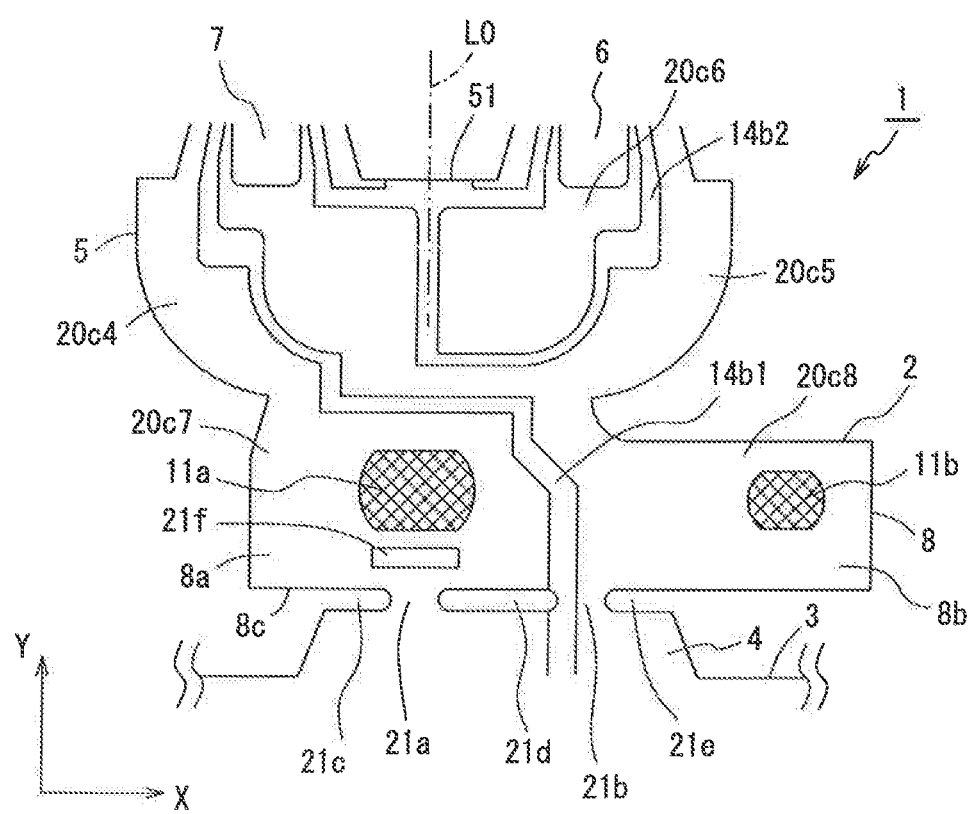
FIG. 21 is a partly enlarged back surface view of a crystal wafer according to a modified example of the third embodiment.

FIG. 21 is a partly enlarged back surface view of the crystal wafer 1, from which the crystal vibration pieces 2 are yet to be separated, according to a modified example of the third embodiment.

In the crystal wafer 1 illustrated in FIG. 21, the break-off part 13 has three slits 21c to 21e and two bridges 21a and 21b on its back-surface side. The extraction electrodes 20c4 and 20c5 are extracted to the bridge 21b from the junction portion-8 side. The bridge 21a is overlapping with the first metal bump 11a in the perpendicular direction. A crack-stop slit 21f is formed between the bridge 21a and the first metal bump 11a. This slit 21f is a groove not penetrating through the junction portion 8.

When the crystal vibration pieces 2 are broken off at the break-off parts 13 of the coupling portions 4 and separated from the crystal wafer 1 further provided with the slits 21f into individual pieces, cracks possibly occur at the lower end of the junction portion 8 in any one of the crystal vibration pieces 2. Yet, the slit 21f may serve to prevent the cracks from further spreading around the first metal bump 11a at the time of ultrasonic bonding of the first and second metal bumps 11a and 11b when the crystal vibration piece 2 is mounted in the package of the crystal vibration device.

The other slit 21b is distantly spaced in the perpendicular direction from the first and second metal bumps 11a and 11b and is overlapping with neither of the first nor second metal bump 11a, 11b. For the same reason as described earlier, the cracks at the bridge 21b originated from breaking off the crystal vibration piece 2 may be prevented from further spreading around the first, second metal bump 11a, 11b.

When the crystal vibration piece 2 separated from the crystal wafer 1 is mounted in the package of the crystal vibration device, the first and second metal bumps 11a and 11b are bonded to the electrode pads by ultrasonic bonding. Yet, any cracks may be prevented from further spreading around the first, second metal bump 11a, 11b, and any frequency drift in operating the crystal vibration device mounted with the crystal vibration piece 2 may be prevented or suppressed as with the embodiment described earlier.

According to this modified example, therefore, the cracks may be prevented by the slit 21f from further spreading around the first metal bump 11a, and the crystal vibration pieces may be further miniaturized to desirably increase the number of crystal vibration pieces obtainable from one crystal wafer Fourth Embodiment Tuning-fork type crystal vibration pieces are used in a broad range of applications as a frequency source of reference signals in, for example, clocks and/or watches. Such a tuning-fork type crystal vibration piece has a pair of vibration arm portions juxtaposed in parallel to each other on one-end side of a base portion. The vibration arm portions are designed to vibrate in bending motions, and any vibration leakages may be fraught with inferior vibration characteristics including poor vibration efficiency and equivalent series resistance, and vibration frequency drift.

An example of the vibration leakages may be a vibration leakage to an end surface of the base portion opposite to the other end surface thereof. It may be contemplated to provide a protrusion on the end surface so as to reduce the vibration leakages directed to the end surface.

With accelerated miniaturization of crystal vibration pieces these days, an interval between one end side and the other end side of the base portion may be increasingly narrower. This may provoke an increase of vibration energy transmitted from the vibration arm portions to the other end surface of the base portion, unfavorably augmenting the vibration leakages.

Providing a protrusion on the end surface alone may no longer be an effective solution for the vibration leakages.

A fourth embodiment of the invention provides for a tuning-fork type crystal vibration piece that may diminish the vibration leakages.

A tuning-fork type crystal vibration piece according to an aspect of the fourth embodiment has a pair of vibration arm portions juxtaposed on one end side thereof and protruding in parallel to each other from the one end side, and a step portion formed in a part of an end surface on the other side opposite to the one side, the step portion including a first protrusion and a second protrusion formed on the first protrusion.

According to this aspect, vibration leakages fraught with vibrations of the pair of vibration arm portions may be diminished by the first protrusion of the step portion and then further diminished by the second protrusion. As compared to a tuning-fork type crystal vibration piece with a flattened end surface or a tuning-fork type crystal vibration piece with a single protrusion formed on an end surface, vibration leakages may be more effectively diminished.

The tuning-fork type crystal vibration piece further has, on the end surface on the other side, a base portion with the pair of vibration arm portions formed on one end surface thereof. In an exemplified structure wherein first and second metal bumps are formed in the base portion in a direction in which the paired vibration arm portions are juxtaposed, the other end surface of the base portion corresponds to the end surface on the other side. In an exemplified structure wherein a junction portion is formed on the other end surface of the base portion opposite to the one end surface, an end surface of the junction portion is located on the other end side, and the step portion is formed on the end surface of the junction portion.

A tuning-fork type crystal vibration piece according to another aspect of the fourth embodiment has a base portion with a pair of vibration arm portions formed on one end surface thereof, and a junction portion formed on the other end surface of the base portion opposite to the one end surface. The junction portion has a basal end part and an extended part. The basal end part has a first metal bump and is protruding toward the other end surface of the base portion from a region including a central line between positions at which the paired vibration arm portions are juxtaposed. The extended par has a second metal bump and is protruding from the base portion toward one side in the arm-juxtaposed direction. The junction portion, with these parts thus arranged, has an L-like shape in plan view. An end surface of the junction portion is located on the other end side, and a step portion is formed on the end surface of the junction portion.

According to this aspect, the junction portion formed on the other end side of the base portion has an L-like shape in plan view. This may extend a travelling distance of the vibration leakages from the end surface on one end side to the end surface on the other end side, consequently more effectively diminishing the vibration leakages.

According to yet another aspect of the fourth embodiment, the first protrusion is formed in a width across a center line between positions at which the vibration arm portions are juxtaposed.

As the paired vibration arm portions vibrate on one end side of the base portion, vibrations are substantially equally transmitted from one end side of the base portion to the end surface on the other end side of the base portion. According to this aspect, the first protrusion formed in a width across the center line between positions at which the vibration arm portions are juxtaposed may equally diminish the transmitted vibration leakages, and the second protrusion, when further diminishing the vibration leakages, may also diminish mutual interference between the vibration leakage brought by one of the vibration arm portions and the vibration leakage brought by the other. This structural advantage may more effectively diminish the vibration leakages.

According to yet another aspect of the fourth embodiment, side surfaces of the first protrusion on both ends thereof in a width direction thereof are rising substantially perpendicularly to the protruding direction from the other end surface of the base portion or the end surface of the junction portion, front and back surfaces of the first protrusion are flat and continuous to the other end surface of the base portion or front and back surfaces of the junction portion, the second protrusion is smaller in width than the first protrusion, and the second protrusion has, on both sides in a width direction thereof regions progressively thinner toward the both ends of the first protrusion in the width direction.

According to this aspect, the side surfaces on both sides of the first protrusion are rising perpendicularly to the protruding direction from the other end surface of the base portion or the end surface of the junction portion, and the front and back surfaces of the first protrusion are flat and continuous to the other end surface of the base portion or front and back surfaces of the junction portion. Then, the vibration leakages from the vibration arm portions to the other end surface of the base portion or to the end surface of the junction portion may be greatly diminished by the first protrusion. Then, the vibration leakages may finally be even further diminished by the second protrusion as the vibration leakages travel through the regions progressively thinner toward both ends of the first protrusion in the width direction. Thus, any adverse influence on the vibration characteristics may be effectively diminished.

According to yet another aspect of the fourth embodiment, both ends of the second protrusion in the width direction are distantly spaced from the first and second metal bumps with no overlap with these bumps in a direction perpendicular to the width direction.

According to this aspect, any cracks near the end surface on the other end side may be prevented from further spreading around the two metal bumps under an external force such as an impact load. This may prevent vibration frequency drift when such an external force is imposed on the crystal vibration piece.

According to yet another aspect of the fourth embodiment, the second protrusion is formed at a position displaced from the center between positions at which the paired vibration arm portions are juxtaposed toward one side in the arm-juxtaposed direction.

According to this aspect wherein the second protrusion is formed at a position displaced toward one side in the arm-juxtaposed direction, mutual interference between the vibration leakages from both sides on the other end side may be effectively neutralized. This may more effectively prevent the vibration leakages from both sides on the other end side.

According to yet another aspect of the fourth embodiment, a top portion and a bottom portion of the second protrusion have flat surfaces continuous to the front and back surfaces of the junction portion.

This aspect may more effectively diminish the vibration leakages transmitted to the second protrusion.

The fourth embodiment is hereinafter described referring to FIG. 22a to FIG. 25.

Figure 22A:
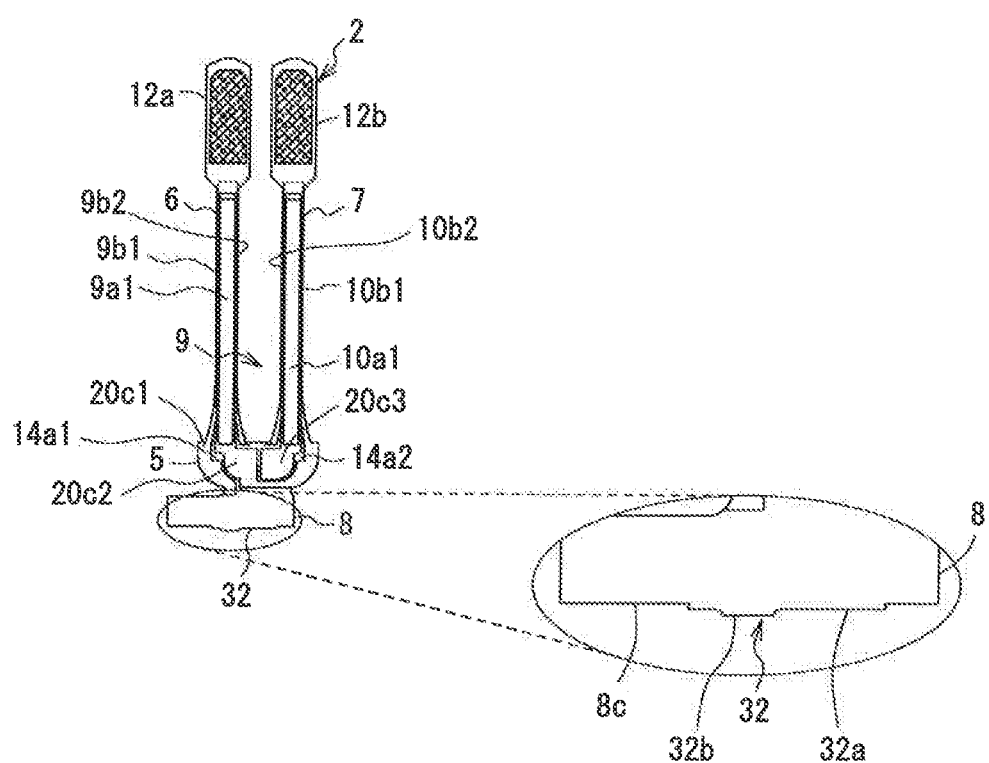
FIG. 22a is a front surface view of a crystal wafer according to a fourth embodiment of the invention.
Figure 22B:
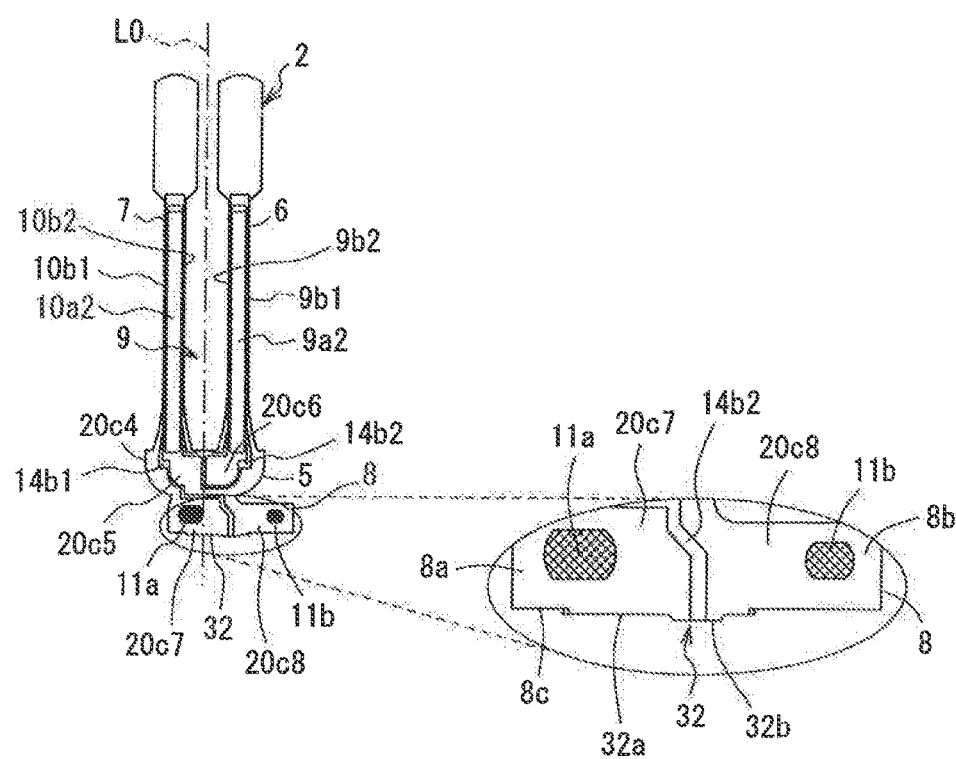
Figure 23:
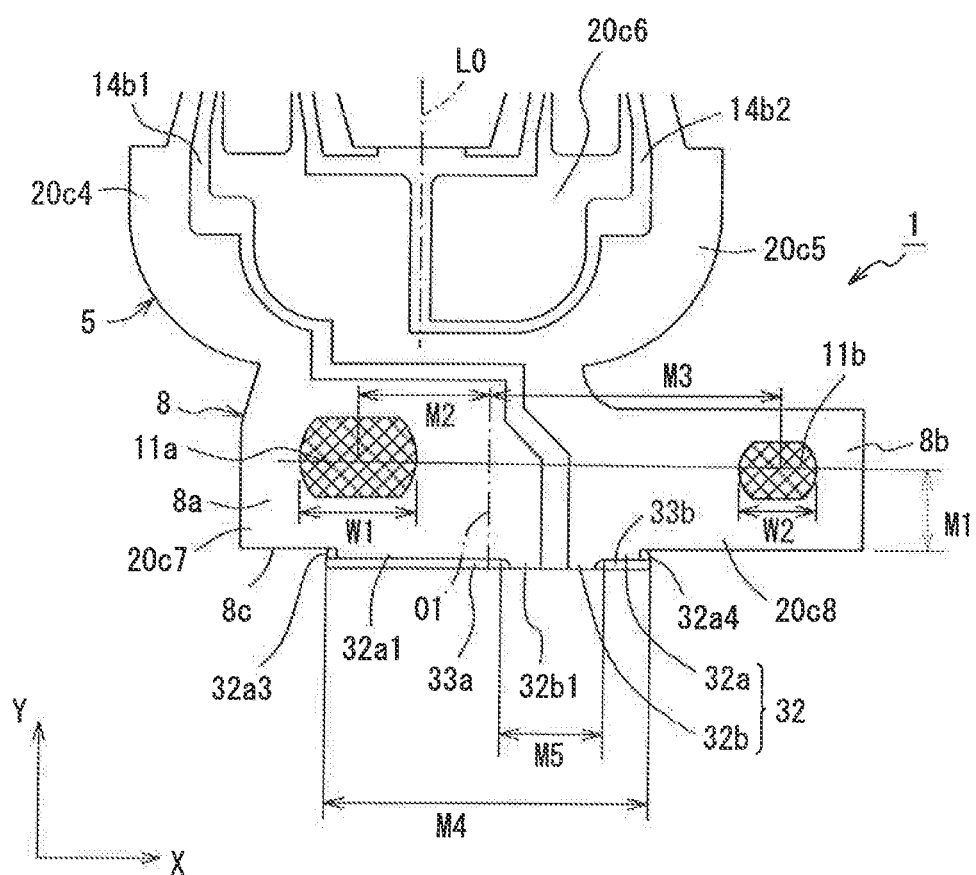
FIG. 23 is an enlarged view of a principal part in the crystal vibration piece illustrated in FIG. 22b.
Figure 24:
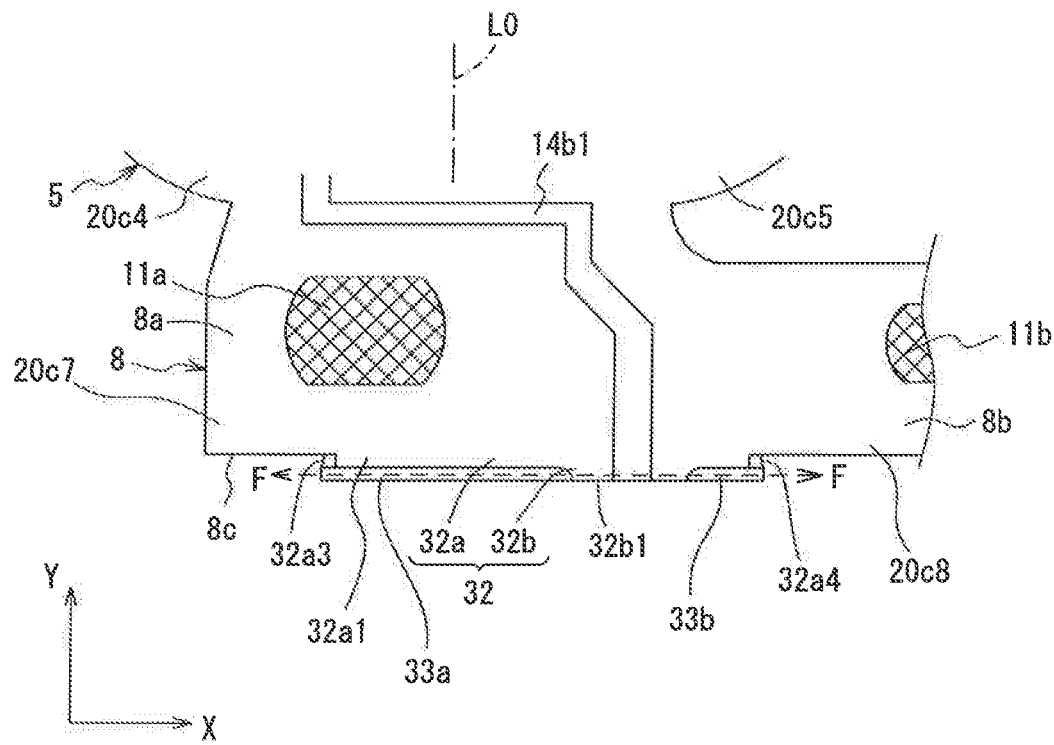
FIG. 24 is a further enlarged view of the principal part illustrated in FIG. 23.
Figure 25:
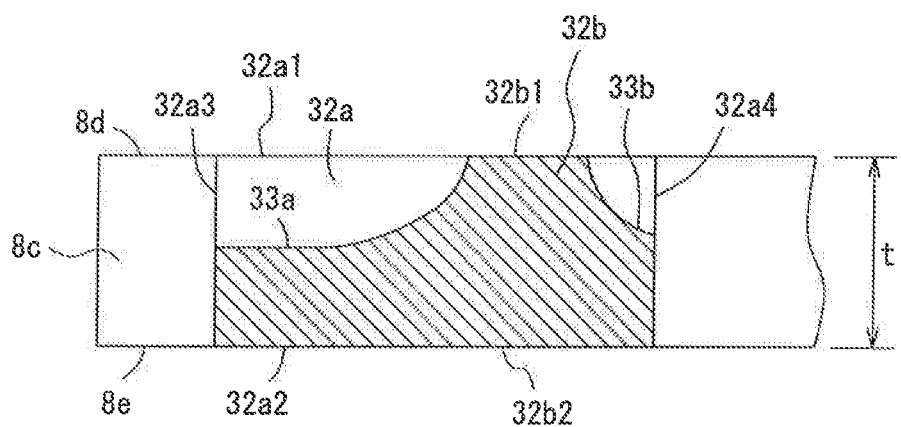
FIG. 25 is an F-F sectional view of the illustration of FIG. 24.

FIG. 22a is a front surface view of the crystal wafer according to the fourth embodiment. FIG. 22b is a back surface view of the crystal vibration piece illustrated in FIG. 22a. FIG. 23 is an enlarged view of a principal part in the crystal vibration piece illustrated in FIG. 22b. FIG. 24 is a further enlarged view of the principal part illustrated in FIG. 23. FIG. 25 is an F-F sectional view of the illustration of FIG. 24. Description of the same structural elements as those described in the earlier embodiments may be partly omitted to avoid redundancy. In these drawings, a reference sign X represents the width direction, and a reference sign Y represents a direction perpendicular to the width direction.

According to the fourth embodiment, the end surface 8c of the junction portion has, in a part thereof in the width direction, a step portion 32 including a first protrusion 32a and a second protrusion 32b formed on the first protrusion 32b, wherein the step portion 32 may further diminish the vibration leakages from the first and second vibration arm portions 6 and 7.

The step portion 32 is a two-step structure including the first protrusion 32a and the second protrusion 32b formed on the first protrusion 32a. With the step portion 32 thus arranged, any vibration leakages from the side surfaces on both sides of the junction portion may be diminished without mutual interference the vibration leakages.

The first protrusion 32a has a width M4 that starts at the basal end part 8a of the junction portion 8 and continues to the extended part 8b beyond the center line L0 with respect to the end surface 8c on the other side of the junction portion 8. The first protrusion 32a has a top portion 32a1 and a bottom portion 32a2 flat and continuous to a front surface 8d and a back surface 8e of the junction portion 8. The first protrusion 32a is protruding from the end surface 8c within an entire thickness t of the junction portion 8. The top portion 32a1 and the bottom portion 32a2 are equal in size and shape in plan view. The first protrusion 32a has ends 32a3 and 32a4 on both sides in the width direction. The ends 32a3 and 32a4 are, with respect to the end surface 8c, protruding straight obliquely outward toward one side and the other side. On the whole, these ends are protruding substantially perpendicularly, preferably approximately 0.01 mm.

The second protrusion 32b has a width M5 smaller than the width M4 of the first protrusion 32a. The second protrusion 32b has a top portion 32b1 and a bottom portion 32b2 flat continuous to the front surface 8d and the back surface 8e of the junction portion 8. The second protrusion 32b has the same thickness as the thickness t of the junction portion 8 and is protruding from the first protrusion 32a. The second protrusion 32b may be preferably protruding from the first protrusion 32a by a protrusion length of approximately 0.005 mm. On both sides of the top portion 32b1 of the second protrusion 32b are regions formed by etching that are progressively thinner and continuous to the both ends 32a3 and 32a4 of the first protrusion 32a. The progressively thinner regions have surfaces 33a and 33b increased in height by degrees toward the second protrusion 32b. The second protrusion 32b is displaced, from the center of the first protrusion 32a in the width direction, in a direction in which the extended part 8b of the junction portion 8 is extending.

The second protrusion 32b is formed at the center between the first and metal bumps 11a and 11b in the width direction. In a direction perpendicular to the width direction, both ends of the second protrusion 32b in the width direction are distant from the first and metal bumps 11a and 11b with no overlap with the first and metal bumps 11a and 11b. In the crystal vibration piece 2 according to this embodiment, therefore, any cracks present near the end surface of the junction portion 8 may be prevented from further spreading around the first, metal bump 11a, 11b under an external force such as an impact load. This may prevent any vibration frequency drift associated with such an external force imposed on the crystal vibration piece.

In the drawing, a reference sign M1 represents a distance between the end surface 8c of the junction portion 8 and the center between the first and metal bumps 11a and 11b in the width direction. The distance M1 may preferably be 0.04 mm to 0.06 mm.

A reference sign M2 represents a distance between a center O1 of the first protrusion 32a in the width direction and the center of the first metal bump 11a in the width direction. The distance M2 may preferably be 0.06 mm to 0.08 mm.

A reference sign M3 represents a distance between the center O1 of the first protrusion 32a in the width direction and the center of the second protrusion 32a in the width direction. The distance M3 may preferably be 0.14 mm to 0.16 mm.

Reference signs W1 and W2 respectively represent widths of the first and second metal bumps 11a and 11b. These widths W1 and W2 may preferably be 0.02 mm to 0.08 mm. A reference sign M4 represents a width of the first protrusion 32a, which may preferably be 0.14 mm to 0.20 mm. A reference sign M5 represents a width of the second protrusion 32b, which may preferably be 0.02 mm to 0.08 mm. The width M5 is a width in the X direction of the bottom section of the second protrusion 32b, which will be described later. The width M5 is smaller than the width M4 of the first protrusion 32a in the X direction. The top portion 32b 1 of the second protrusion 32b may have an optional width in the X direction. In relation to stresses to the first and second metal bumps 11a and 11b, the width M5 of the second protrusion 32b may preferably be less than or equal to the widths W1 and W2 of the first and second metal bumps 11a and 11b.

Figure 26:
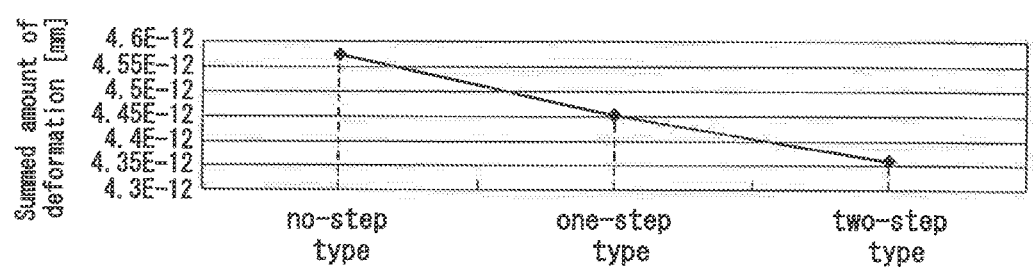

Referring to FIG. 26, a description is given to the effect of diminishing the vibration leakages achievable by the step portion 32 of the crystal vibration piece 2 structured as described so far.

The vibration leakage diminishing effect is described by way of comparison among a crystal vibration piece according to a first comparative example in which the end surface 8c of the junction portion 8 is flat with no protrusion (hereinafter, "no-step" type), a crystal vibration piece according to a second comparative example in which the end surface 8c of the junction portion 8 has a single protrusion (hereinafter, "one-step" type), and the crystal vibration piece 2 according to this embodiment in which the end surface 8c of the junction portion 8 has two protrusions (hereinafter, "two-step" type).

Referring to FIG. 26, the "no-step" type shown on the lateral axis refers to the crystal vibration piece according to the first comparative example, the "one-step" type shown on the lateral axis refers to the crystal vibration piece according to the second comparative example, and the "two-step" type shown on the lateral axis refers to the crystal vibration piece 2 according to this embodiment. The longitudinal axis shows a summed amount of deformation of each crystal vibration piece (mm), which is the indication of a degree of vibration leakages.

A vibration leakage simulation was carried out for each of these crystal vibration pieces. The simulation result exhibited a degree of vibration leakages of approximately 4.36E-12 in the crystal vibration piece 2 according to this embodiment in contrast to approximately 4.56E-12 in the crystal vibration piece according to the first comparative example and approximately 4.45E-12 in the crystal vibration piece according to the second comparative example.

This demonstrates that the vibration leakages in the crystal vibration piece according to this embodiment were diminished as compared to the crystal vibration pieces according to the first and second comparative examples.

The crystal vibration piece of "two-step" type according to this embodiment has, on the end surface of the junction portion 8, the step portion 22 including the first and second protrusions 32a and 32b. This crystal vibration piece may more effectively diminish the vibration leakages from the first and second vibration arm portions 6 and 7 than the conventional crystal vibration pieces of "no-step" type and "one-step" type.

In the crystal vibration piece according to this embodiment, the second protrusion 32b is formed at a position displaced from the first protrusion 32a. Since a position at which the second protrusion 32b is formed on the first protrusion 32a may affect the vibration leakage diminishing effect, the position of the second protrusion is not necessarily limited as described in the embodiment but may be optionally decided through experiments.

Production of Crystal Vibration Piece

Figure 27:
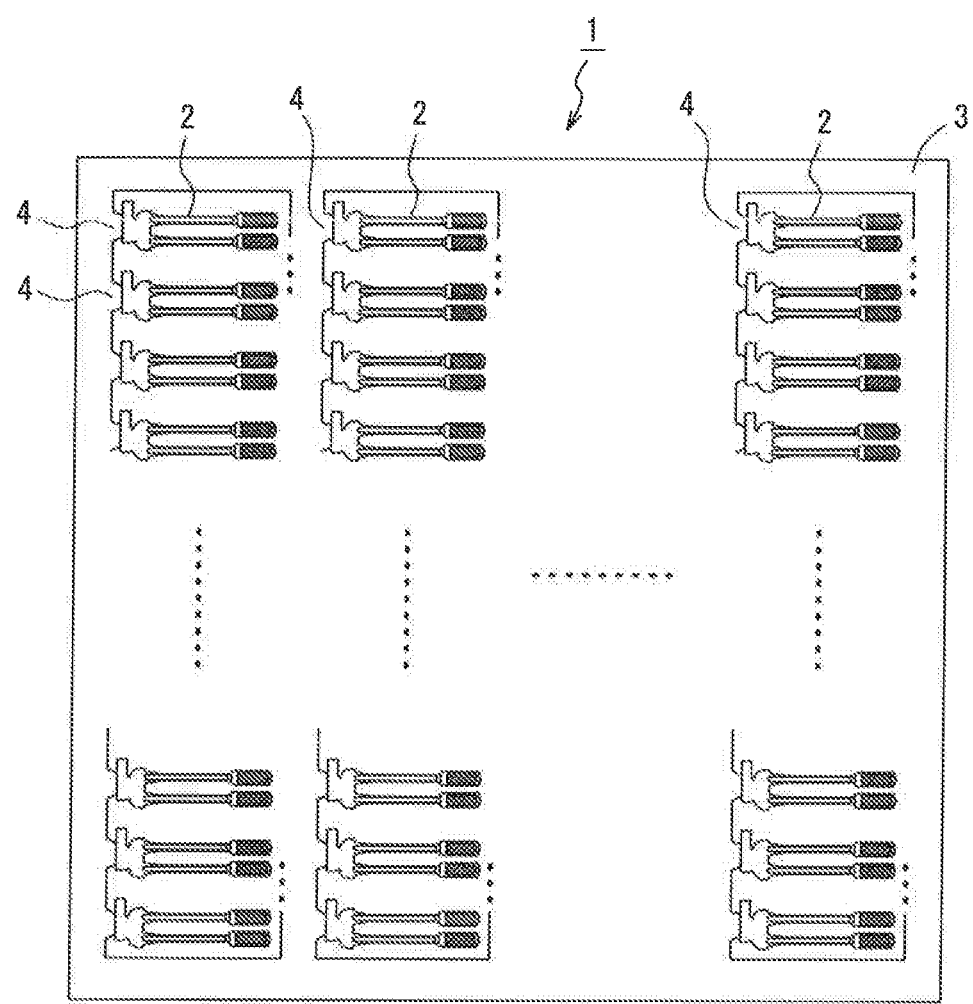
Figure 28A:
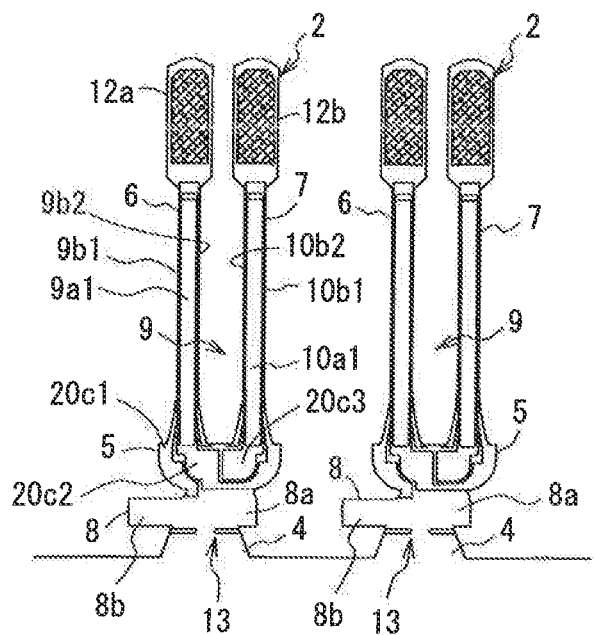
FIG. 28a is a partly enlarged view of the crystal wafer illustrated in FIG. 27.
Figure 28B:
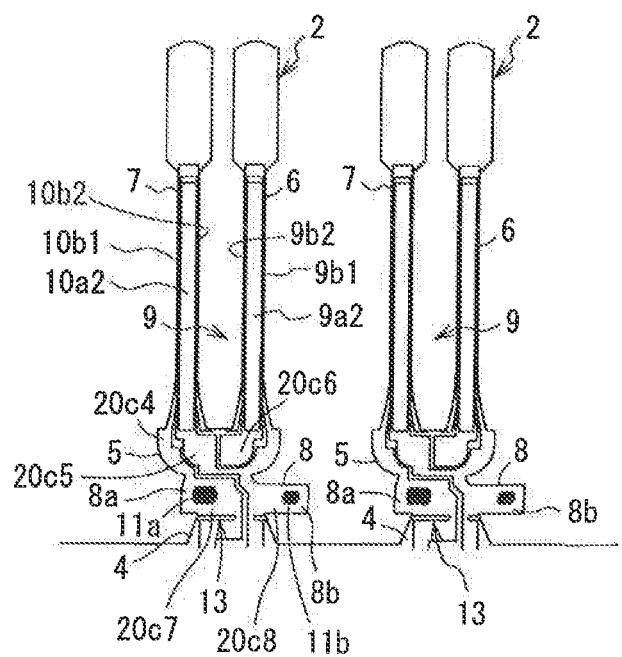
FIG. 28b is a partly enlarged back surface view of the illustration of FIG. 27.
Figure 29:
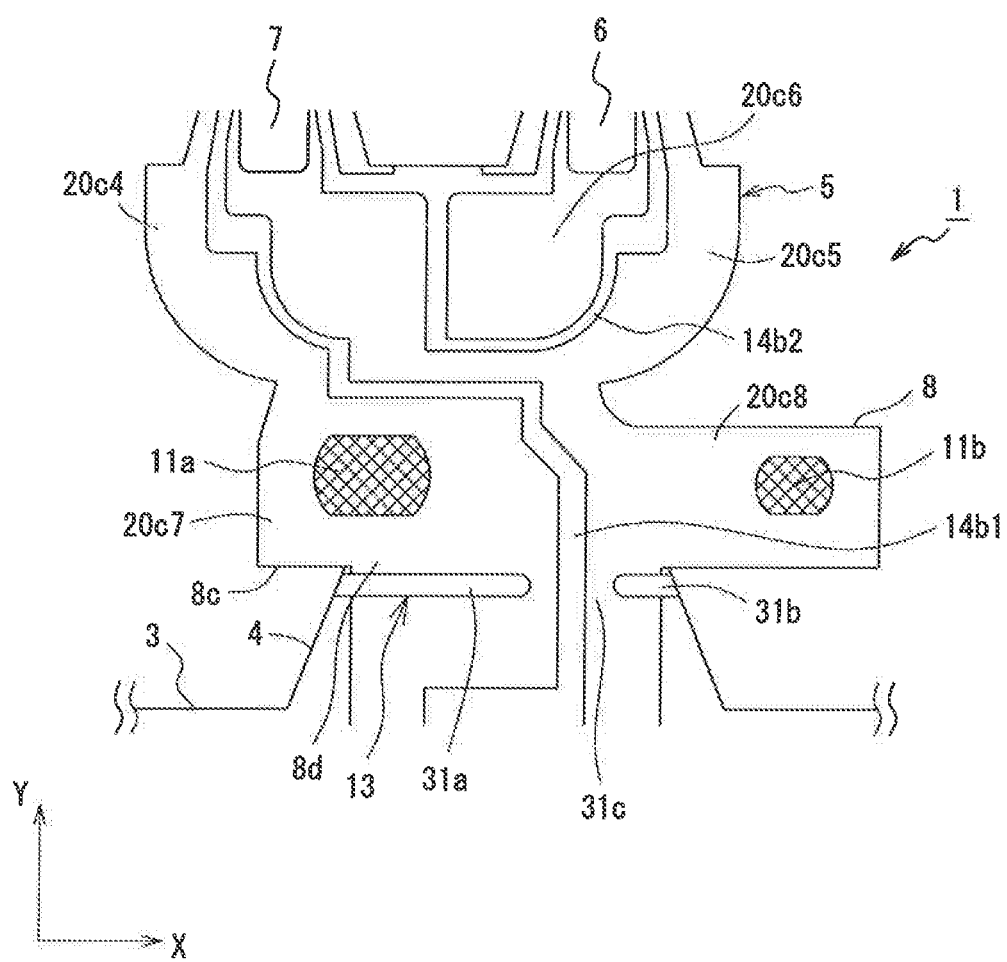
FIG. 29 is an enlarged view of a principal part in the illustration of FIG. 28b.

An exemplified production of the crystal vibration piece 2 according to this embodiment is described referring to FIGS. 27 to 29. FIG. 27 is an overall plan view of a crystal wafer for use in fabricating crystal vibration pieces according to this embodiment. FIGS. 28a and 28b are partly enlarged views of the crystal wafer illustrated in FIG. 27. FIG. 29 is an enlarged view of a principal part illustrated in FIG. 28b. The same structural elements in these drawings are illustrated with the same reference signs.

Referring to these drawings, a crystal wafer 1 is essentially configured similarly to the crystal wafer according to the first embodiment, wherein a protrusion 3d corresponding to the first protrusion 32a is formed on the end surface 8c of the coupling portion 4. The break-off part 13 has grooved slits 31a and 31b extending along the protrusion 8d in the width direction of the coupling portion 4. These grooved slits 31a and 31b are not penetrating through the front and back surfaces of the coupling portion 4. No slit is formed in a part in the width direction between these slits 31a and 31b. This part in the width direction constitutes a bridge 31c having both surfaces continuous to the front and back surfaces of the crystal wafer 1. The bride 31c serves to couple the crystal vibration piece 2 to the coupling portion 4.

According to this embodiment, the slits 31a and 31b are grooved slits not penetrating through the front and back surfaces of the coupling portion 4. Instead, they may be grooved slits penetrating through the front and back surfaces of the coupling portion 4.

When the crystal vibration piece 2 supported on the frame portion 3 in this crystal wafer 1 is broken off at the break-off part 13 formed in the coupling portion 4, the step portion 32 is formed at the break-off end part on the end surface 8c of the junction portion 8 of the crystal vibration piece 2. The step portion 32 includes the first protrusion 32a corresponding to the protrusion 8d formed on the end surface 8c of the junction portion 8 and the second protrusion 32b corresponding to the bridge 13c.

When the crystal vibration piece 2 is broken off and separated from the crystal wafer 1, cracks possibly originating from the bridge 13c may spread to the break-off end part of the bridge 13c at which the crystal vibration piece 2 is broken off. In case the crystal vibration piece 2 with cracks at the break-off end part is exposed to an external force such as an impact load, the cracks may further spread around the first, second metal bump 11a, 11b. Such an outspread of the cracks may result in frequency drift in the crystal vibration piece 2, involving the risk of degrading the vibration characteristics of the crystal vibration piece 2.

To avoid that, the crystal wafer 1 has the bridge 13c formed at the center in the width direction between the first and second metal bumps 11a and 11b. Then, both ends of the bridge 13c in the width direction may be distantly spaced from the first and second metal bumps 11a and 11b in the direction perpendicular to the width direction with no overlap with the first and second metal bumps 11a and 11b.

In case any cracks are generated at the break-off end part in the crystal vibration piece 2 broken off and separated from the frame portion 3 of the crystal wafer 1, the cracks may be prevented from further spreading around the metal bump, 11a, 11b, under an external force such as an impact load. This may effectively suppress any frequency drift associated with the cracks.

As described thus far, the fourth embodiment provides, on the end surface of the junction portion 8 on the other end side of the crystal vibration piece 2, the step portion 32 including the first protrusion 32a and the second protrusion 32b formed thereon in a smaller width than the first protrusion 32a. This structural advantage may effectively diminish the vibration leakages from the side surfaces to the end surface 8c of the junction portion 8.

The fourth embodiment is characterized in that the step portion is formed on the end surface 8c of the junction portion 8. However, the step portion 22 may be formed on the other end surface of the base portion 5 in any crystal vibration piece with no junction portion 8 wherein the first and second metal bumps 11a and 11b are formed on the extraction electrodes 20c4 and 20c6 of the base portion 5 in the direction in which the first and second vibration arm portions 6 and 7 are juxtaposed.

It should be understood that the invention is not limited to the embodiments described thus far. The invention may be carried out in many other forms without departing from its technical concept or principal technical features. The embodiments described so far are just a few examples of the invention in all aspects, which should not be construed to restrict the scope of the invention. The scope of this invention is solely defined by the appended claims, and should not be restricted by the text of this description. Any modifications or changes made within the scope of the appended claims are all included in the scope of this invention.

The invention claimed is:
1. A piezoelectric wafer, comprising:
a piezoelectric vibration piece;
a frame portion that supports the piezoelectric vibration piece; and
a coupling portion that couples the piezoelectric vibration piece to the frame portion, wherein
the coupling portion is configured for breaking off the piezoelectric vibration piece from the frame portion at the coupling portion,
grooved slits extending along a width direction of the coupling portion are formed on front and back surfaces of the coupling portion except for a part of the coupling portion in the width direction,
an electrode on at least one of front and back surfaces of the piezoelectric vibration piece which is extracted to a frame-portion side of the piezoelectric wafer by way of the part of the coupling portion in the width direction, and
the grooved slits are formed on both sides of the part of the coupling portion in the width direction in a manner that the parts are interposed between the grooved slits.

2. The piezoelectric wafer as claimed in claim 1, wherein
the electrode extracted to the frame-portion side of the piezoelectric wafer is a pair of electrodes for frequency adjustment, and
the pair of electrodes for frequency adjustment are formed on one of the front and back surfaces of the coupling portion.

3. The piezoelectric wafer as claimed in claim 1, wherein
the electrode extracted to the frame-portion side is a pair of electrodes for frequency adjustment, and
one electrode and another electrode of the pair of electrodes for frequency adjustment are respectively formed on the front and back surfaces of the coupling portion.

4. The piezoelectric wafer as claimed in claim 1, wherein
the parts in the width direction on the front and back surfaces of the coupling portion are formed at positions displaced from each other in the width direction.

5. A piezoelectric vibration piece produced by breaking off and separating the piezoelectric vibration piece from the frame portion of the piezoelectric wafer of claim 1, the piezoelectric vibration piece further comprising, in a break-off end part broken off from the frame portion:
planar parts in which the front and back surfaces of the piezoelectric vibration piece are continuous as far as a break-off end of the break-off end part; and
bent parts in which the front and back surfaces of the piezoelectric vibration piece are bending, the planar parts and the bent parts being formed in a direction in which the piezoelectric vibration piece is broken off, wherein
the bent parts on the front and back surfaces are bending toward a front-surface side or a back-surface side of the piezoelectric vibration piece to reduce thickness, and
electrodes of the piezoelectric vibration piece are extracted to the break-off end in the planar part in which at least one of the front and back surfaces is continuous.

6. The piezoelectric vibration piece as claimed in claim 5, wherein
the planar part in which the front surface of the piezoelectric vibration piece is continuous and the planar part in which the back surface of the piezoelectric vibration piece is continuous are formed at positions displaced from each other in a direction in which the piezoelectric vibration piece is broken off.

7. The piezoelectric vibration piece as claimed in claim 5, wherein
the electrode extracted to the break-off end is a pair of electrodes for frequency adjustment, and
the pair of electrodes for frequency adjustment is formed in the planar part in which one of the front and back surfaces is continuous.

8. The piezoelectric vibration piece as claimed in claim 5, wherein
the electrode extracted to the break-off end is a pair of electrodes for frequency adjustment, and
one electrode and another electrode of the pair of electrodes for frequency adjustment are formed in the planar part in which the front and back surfaces is continuous.

9. A piezoelectric vibration piece produced by breaking off and separating the piezoelectric vibration piece from the frame portion of the piezoelectric wafer of claim 1, the piezoelectric vibration piece further comprising:
a base portion; and
a pair of vibration arm portions, the pair of vibration arm portions being juxtaposed and protruding from one end surface of the base portion, wherein
a plurality of extraction electrodes are formed on a front main surface, a back main surface, and side surfaces on both sides in each of the pair of vibration arm portions,
base portion extraction electrodes are formed on the base portion, the base portion extraction electrodes including a base portion extraction electrode for connection by which the driving electrodes are partly common-connected, and a pair of base portion extraction electrodes for external use to which the driving electrodes are partly externally extracted, and
the base portion extraction electrodes are greater in thickness than the driving electrodes formed on the front and back main surfaces of the vibration arm portions.

10. The piezoelectric vibration piece as claimed in claim 9, wherein
edge-of-arm extraction electrodes by which the driving electrodes are partly common-connected axe formed on edge sides of the vibration arm portions,
the edge-of-arm extraction electrodes are greater in thickness than the driving electrodes, and
the base portion extraction electrodes are at least substantially equal in thickness to the edge-of-arm extraction electrodes.

11. The piezoelectric vibration piece as claimed in claim 9, comprising a junction portion protruding from another end surface of the base portion, wherein
the junction portion comprises:
a basal end part protruding from position including a central line on the another end surface of the base portion between positions at which the pair of vibration arm portions are juxtaposed; and
an extended part extending from the basal end part toward one side in a direction in which the pair of vibration arm portions are juxtaposed, the junction portion comprising the basal end part and the extended part has an L-like shape in plan view,
a first junction extraction electrode for external use to which one of the pair of base portion extraction electrodes for external use is extracted is formed on a surface of the basal end part, and a first metal bump is formed in an upper part of the first junction extraction electrode for external use, a second junction extraction electrode for external use to which the other one of the pair of base portion extraction electrodes for external use is extracted is formed on a surface of the extended part, and a second metal bump is formed in an upper part of the second junction extraction electrode for external use, and the first metal bump is greater in size in plan view than the second metal bump.

12. The piezoelectric vibration piece as claimed in claim 10, wherein
the edge-of-arm extraction electrodes have surface layers plated with a metal,
metal bumps are formed in upper parts of the base portion extraction electrodes for external use or upper parts of the junction extraction electrodes for external use, and
the metal bumps have surface layers plated with the same metal as the plating metal of the edge-of-arm extraction electrodes.

13. The piezoelectric vibration piece as claimed in claim 9, wherein
the base portion has side parts symmetrically and equally shaped in plan view relative to a central line between positions at which the pair of vibration arm portions are juxtaposed, and
the base portion extraction electrodes are electrically insulated from each other and formed in an equal thickness on substantially the whole front and back surfaces of the base portion.

14. The piezoelectric wafer as claimed in claim 1, further comprising a pair of first and second metal bumps juxtaposed and distantly spaced from each other in the width direction of the coupling portion,
ends in the width direction of the part of the coupling portion in the width direction are remotely spaced from the first and second metal bumps with no overlap with the first and second metal humps in a direction perpendicular to the width direction.

15. The piezoelectric wafer as claimed in claim 14, wherein
sections largest in width of the parts of the coupling portion in the width direction are not overlapping with the first and second metal bumps in the direction perpendicular to the width direction.

16. The piezoelectric wafer as claimed in claim 14, wherein
the parts of the coupling portion in the width direction are formed at central positions in the width direction between positions at which the first and second metal bumps are juxtaposed.

17. The piezoelectric wafer as claimed in claim 14, further comprising:
a pair of vibration arm portions;
a junction portion joined to an external element; and
a base portion having the pair of vibration arm portions juxtaposed on one end surface thereof and the junction portion formed on another end surface thereof opposite to the one end surface, wherein
the pair of vibration arm portions is protruding in parallel to each other from the one end surface of the base portion,
the junction portion comprises:
a basal end part formed at a middle position on the another end surface of the base portion in a direction in which the paired vibration arm portions are juxtaposed, the basal end part having the first metal bump formed thereon; and an extended part extending from the basal end part toward one side in the width direction of the coupling portion, the extended part having the second metal hump formed thereon, the junction portion comprising the basal end part and the extended part has an L-like shape in plan view, and
the first metal bump is greater in size in plan view than the second metal bump.

18. The piezoelectric vibration piece as claimed in claim 14, further comprising:
a vibrating unit disposed on at least one end side thereof;
a junction portion for external use formed on another end side opposite to the one end side; and
a break-off end part produced by breaking off the break-off end part from the frame portion on an end surface on the another end side, wherein
an end of the break-off end in the width direction is remotely spaced from the first and second metal bumps with no overlap with the first and second metal bumps in a direction perpendicular to the width direction of the coupling portion.

19. The piezoelectric vibration piece as claimed in claim 18, wherein
the vibrating unit is a pair of vibration arm portions in the form of a tuning fork each having driving electrodes formed on a front surface, a back surface, side surfaces on both sides thereof.

20. The piezoelectric vibration piece produced by breaking off and separating the piezoelectric vibration piece from the frame portion of the piezoelectric wafer of claim 1, the piezoelectric vibration piece further comprising a pair of vibration arm portions protruding in parallel to each other from one end side thereof, wherein
a step portion including a first protrusion and a second protrusion formed on the first protrusion is formed in a part on an end surface on another end side opposite to the one end side.

21. The piezoelectric vibration piece as claimed in claim 20, further comprising:
a base portion with the pair of vibration arm portions formed on one end surface thereof; and
a junction portion formed on another end surface of the base portion opposite to the one end surface, wherein
the junction portion comprises:
a basal end part having a first metal bump and protruding toward the another end surface of the base portion from a region including a central line between positions at which the pair of vibration arm portions are juxtaposed; and
an extended part having a second metal bump and protruding from the base portion toward one side in a direction in which the paired vibration arm portions are juxtaposed, the junction portion comprising the basal end part and the extended part has an L-like shape in plan view, and
an end surface of the junction portion is located on the another end side, and a step portion is formed on the end surface of the junction portion.

22. The piezoelectric vibration piece as claimed in claim 20, wherein
the first protrusion is formed in a width across a center line between positions at which the vibration arm portions are juxtaposed.

23. The piezoelectric vibration piece as claimed in claim 20, wherein
side surfaces of the first protrusion on both ends thereof in a width direction thereof are rising substantially perpendicularly to a direction protruding from the another end surface of the base portion or the end surface of the junction portion, and front and back surfaces of the first protrusion are flat and continuous to the front and back surfaces of the junction portion, the second protrusion is smaller in width than the first protrusion, and the second protrusion has, on both sides in a width direction thereof, regions progressively thinner toward the both ends of the first protrusion in the width direction.

24. The piezoelectric vibration piece as claimed in claim 20, wherein both ends of the second protrusion in the width direction are distantly spaced front the first and second metal bumps with no overlap with the first and second bumps in a direction perpendicular to the width direction.

25. The piezoelectric vibration piece as claimed in claim 20, wherein the second protrusion is formed at a position displaced from a central position between positions at which the paired vibration arm portions are juxtaposed toward one side in a direction in which the pair of vibration arm portions are juxtaposed.

26. The piezoelectric vibration piece as claimed in claim 22, wherein a top portion and a bottom portion of the second protrusion have flat surfaces continuous to the front and back surfaces of the junction portion.

27. A piezoelectric vibrator comprising the piezoelectric vibration piece as claimed in claim 5 supported in a package.

28. A piezoelectric vibrator comprising the piezoelectric vibration piece as claimed in claim 9 supported in a package.

29. A piezoelectric vibrator comprising the piezoelectric vibration piece as claimed in claim 18 supported in a package.

30. A piezoelectric vibrator comprising the piezoelectric vibration piece as claimed in claim 20 supported in a package.

31. A method of producing a piezoelectric vibration piece, comprising:

producing the piezoelectric wafer of claim 1; and breaking off and separating the piezoelectric vibration piece from the frame portion of the piezoelectric wafer.

\* \* \* \* \*